United States Patent [19]
Ishihara

[11] Patent Number: 5,557,648
[45] Date of Patent: Sep. 17, 1996

[54] PHASE LOCK LOOP CIRCUIT USING A SAMPLE AND HOLD SWITCH CIRCUIT

[75] Inventor: Noboru Ishihara, Atsugi, Japan

[73] Assignee: Nippon Telegraph and Telephone Corporation, Tokyo, Japan

[21] Appl. No.: 194,668

[22] Filed: Feb. 14, 1994

[30] Foreign Application Priority Data

Mar. 1, 1993 [JP] Japan .................... 5-062465

[51] Int. Cl.$^6$ ...................................... H03D 3/24
[52] U.S. Cl. ............................ 375/376; 331/16; 331/1 A
[58] Field of Search ..................... 375/371, 373, 375/375, 376, 360; 331/14, 34, 1 A, 1 R, DIG. 2, 16, 17, 18, 25; 327/141, 155, 156, 158, 159, 160, 161, 162

[56] References Cited

U.S. PATENT DOCUMENTS

| | | |
|---|---|---|
| 3,573,649 | 4/1971 | West . |
| 4,061,979 | 12/1977 | Walker et al. . |
| 4,825,437 | 4/1989 | Balech ................................... 375/376 |
| 5,028,885 | 7/1991 | Voigt et al. .............................. 331/1 A |
| 5,036,298 | 7/1991 | Bulzachelli . |

FOREIGN PATENT DOCUMENTS

| | | |
|---|---|---|
| 355466 | 2/1990 | European Pat. Off. . |
| 517431 | 12/1992 | European Pat. Off. . |
| 83/01120 | 3/1983 | WIPO . |

OTHER PUBLICATIONS

Lawrence Devito et al, "TPM 8.6: A 52 Mhz and 155 MHz Clock–Recovery PLL", *IEEE International Solid–State Circuits Conference*, Feb. 14, 1991, pp. 142, 143 & 306.

Mihai Banu et al, "TA 6.4: A 660Mb/s CMOS Clock Recovery Circuit with Instantaneous Locking for NRZ Data and Bursi–Mode Transmission", *IEEE International Solid–State Circuits Conference*, Feb. 25, 1993, pp. 102 & 103.

Mehmet Soyuer et al, "TP 10.4: A Monolithic 2.3Gb/s 100m W Clock and Data Recover Circuit", *IEEE International Solid–State Circuits Conference*, Feb. 25, 1993, pp. 158 & 159.

*Primary Examiner*—Stephen Chin
*Assistant Examiner*—Huong Luu
*Attorney, Agent, or Firm*—Spencer & Frank

[57] ABSTRACT

A phase lock loop circuit that can be formed into a full monolithic integrated circuit without an external component part, and that can maintain the phase locked state even for a consecutive identical bit state of input data including more than several tens of consecutive identical bits. The input data applied to a data input terminal is doubled in frequency by a doubler. A phase difference between the output of the doubler and that of a VCO is detected by a phase comparator, and is supplied to a low-pass filter through a sample and hold switch circuit. The low-pass filter produces a DC output corresponding to the phase difference, and supplies it to the frequency control terminal of the VCO. The output frequency of the VCO is controlled so that the phase difference becomes zero. The sample and hold switch circuit is maintained at the off state (holding mode) during the consecutive identical bit state to hold the output of the low-pass filter, so that the VCO continues that frequency at the beginning of the consecutive identical bit state.

37 Claims, 37 Drawing Sheets

| PARAMETERS | PROTOTYPE IC | | REFERENCE PRODUCT |
|---|---|---|---|
| TRANSMISSION RATE | 155.52 Mb/s | | |
| EXTERNAL COMPONENT | UNNECESSARY | 47000pF | 47000pF |
| NATURAL ANGULAR FREQUENCY | $7.5 \times 10^7$ rad/s | $1.9 \times 10^6$ rad/s | ——— |
| DAMPING FACTOR | 1.2 | 40 | 5.0 |
| CAPTURE RANGE | >±10MHz | >±10MHz | ±0.5MHz |
| LOCK RANGE | >±15MHz | >±15MHz | ±0.5MHz |
| JITTER OF OUTPUT DATA | 1.2degrees (20psec) | 0.95degrees (17psec) | 3.5degrees |
| JITTER OF CLOCK SIGNAL | | | |
| RESISTANCE TO CONSECUTIVE IDENTICAL BITS | 24bits | >700bits | 240bits |
| POWER SUPPLY VOLTAGE | -5.2V and -2V | | -5.2V |
| POWER CONSUMPTION | 320mW | | 728mW |

FIG.22C

PHASE LOCK LOOP CIRCUIT USING A SAMPLE AND HOLD SWITCH CIRCUIT

BACKGROUND OF THE INVENTION

1. Field of the Invention

The present invention relates to a phase lock loop circuit using a sample and hold switch circuit which can maintain a stable operation in spite of input data which includes many consecutive identical bits (0s or 1s ) in a data transmission system, or the like.

2. Description of Related Art

Phase lock loop circuits play an important role as a basic circuit element in data transmission systems such as communication networks or computer networks. They are employed for examples, in repeating circuits or terminating circuits of a data transmission system as a timing signal recovery circuit for generating a clock signal from data, or as a skew timing control circuit for adjusting timings between data and clock signals.

FIG. 1 shows a conventional circuit which employs a phase lock loop circuit for deciding data and recovering a timing signal (clock signal). In this figure, the reference numeral 1 designates a decision circuit for detecting data, 2 designates a doubler, 3 designates a voltage controlled oscillator (VCO), 4 designates a phase comparator, 5 designates a low-pass filter (LPF), 6 designates a data input terminal, 7 designates a data output terminal, and 12 designates a timing signal (clock signal) output terminal.

The input data 6A applied to the data input terminal 6 is doubled in frequency by the doubler 2, and its output signal 2A is compared with the VCO output 3A by the phase comparator 4. The output 4A of the phase comparator 4 is converted to a DC (direct current) voltage 5A by the low-pass filter 5, and is fed back to all oscillation frequency control terminal of the VCO 3. Thus, the timing signal (clock signal) in phase with the input data 6A is recovered. The decision circuit 1 detects the logic state of the input data 6A using the clock signal, and outputs the detected data through the data output terminal 7.

FIG. 2 schematically illustrates operational waveforms of various portions of the conventional circuit of FIG. 1 during the phase lock process. The input data 6A to the data input terminal 6, the output data 7A from the data output terminal 7, the doubler output 2A of the doubler 2, the VCO output 3A of the VCO 3, the phase compared output 4A of the phase comparator 4, and the low-pass filter output 5A of the low-pass filter 5 are shown in (A)–(F) of FIG. 2, respectively. The phase compared output 4A from the phase comparator 4 is illustrated in terms of (a) phase lead, (b) in phase, and (c) phase lag, and the low-pass filter output 5A is illustrated in terms of a phase lead and a phase lag.

The operation of the conventional circuit of FIG. 1 will be described referring to FIG. 2. The input data 6A is converted by the doubler 2 into the waveform 2A as shown in (C) of FIG. 2. This waveform 2A is compared with the VCO output 3A by the phase comparator 4. When the phase of the VCO output 3A leads that of the doubler output 2A, the phase comparator 4 produces a pulse train including positive pulses whose width corresponds to the phase difference as shown in (a) of (E). Conversely, when the phase of the VCO output 3A lags behind that of the doubler output 2A, the phase comparator 4 generates a pulse train including negative pulses as shown in (c) of (E), and when the phases of the two agree, no pulse is generated as shown in (b) of (E).

Subsequently, the compared output 4A from the phase comparator 4 is passed through the low-pass filter 5, and is converted into a continuous low frequency signal as shown in (F). The low-pass filter output 5A is negatively fed back to the oscillation frequency control terminal of the VCO 3, and the operation of the system converges on the basis of the feedback logic in such a manner that the phase difference between the doubler output 2A and the VCO output 3A becomes minimum. As a result, the VCO output 3A (that is, the timing signal, or the clock signal) in synchronism with the input data 6A is obtained. The decision circuit 1 is a functional circuit that detects the logic state of the input data 6A by using the clock signal recovered as described above. For example, detecting the input data 6A using the falling edges of the clock signal will give the output waveform 7A as shown in (B) of FIG. 2 as a result of deciding the logic state.

The conventional circuit of FIG. 1, however, has a problem in that the phase lock loop circuit becomes unstable for consecutive identical bits, and may fall into all unlocked state depending on the number of consecutive identical bits. The consecutive 0s of the input data 6A in (A) of FIG. 2 illustrates this. In this case, since the output 2A of the doubler 2 becomes zero as shown in (C), the phase comparing operation between the output 2A and the VCO output 3A cannot be carried out. Thus, the phase compared output 4A from the phase comparator 4 will be independent of the phase difference between the doubler output 2A and the VCO output 3A during this interval.

Therefore, the output 4A of the phase comparator 4 is not obtained as shown in (a) and (c) of (E) of FIG. 2. Therefore, the phase lock loop circuit operates in such a manner that it automatically returns to its initial state, in which no input data is applied to the input terminal 6. In addition, the low-pass filter output 5A is also pulled back to its initial state during the consecutive 0s as shown in (F) of FIG. 2. Accordingly, the oscillation frequency of the VCO 3 also returns to its initial value. As a result, the conventional phase lock loop circuit cannot maintain the phase locked state for input data including a long consecutive identical bit state.

Generally speaking, an increasing resistance to the consecutive identical bit state can be achieved as the time constant of the low-pass filter 5 is increased. An excessive time constant, however, causes a reduction in the open-loop gain of the phase lock loop circuit, which is the tradeoff with the readiness of being pulled into the locked state at the start of operation of the phase lock loop circuit. For this reason, this method of increasing the time constant cannot be practically applied to such a system that handles input data including several tens of consecutive identical bits. Moreover, a low-pass filter having a large time constant is bulky, and this presents a problem in that it is difficult for a phase lock loop circuit including such a low-pass filter to be integrated into a monolithic integrated circuit. Furthermore, the conventional circuit of FIG. 1 presents a problem in that it sometimes cannot detect the data at the optimum point (the center of individual bits) because the phase relationship between the timing signal of the decision circuit 1 and the input data 6A is impaired owing to the absolute delay due to lines or wire. In particular, in a high-speed circuit, this mistiming of detection will increase an error rate due to faulty operation, which presents another problem.

FIG. 3 shows another circuit for recovering data and a timing signal (clock signal) by using a conventional phase lock loop circuit. This circuit differs from the conventional circuit of FIG. 1 in that it does not include the doubler 2, and that it performs the phase comparison between the input and output of the decision circuit 1 rather than between the doubler output 2A and the VCO output 3A. The other portions are the same as those of FIG. 1.

FIG. 4 schematically illustrates the operational waveforms of various portions of the conventional circuit as shown in FIG. 3 during the phase lock process. FIG. 4 differs from FIG. 2 in that it does not include the doubler output 2A, and the other signals 6A, 7A, 3A, 4A and 5A are similar to those of FIG. 2. The operation of the conventional circuit of FIG. 3 will be described below with reference to FIG. 4.

First, it should be noticed that the phase of the output data 7A lags behind that of the input data 6A by half a period under the condition that the logic state of the input data is decided by an optimum clock signal. The conventional circuit of FIG. 3 uses this, and the phase comparator 4 detects whether the phase difference between the input data 6A and the output data 7A is maintained at half the period of the data, and outputs the phase compared output 4A. For example, when the phase of the output data 7A of the decision circuit 1 leads that of the half-period delayed input data 6A as shown in (A) and (B) of FIG. 4, a pulse train consisting of positive pulses whose width corresponds to the phase difference is generated as shown in (a) of (D) of FIG. 4. In contrast, when the phase of the output data 7A lags behind that of the half-period delayed input data 6A, a pulse train consisting of negative pulses is generated as shown in (c) of (D), and when there is no phase difference between the two, no pulse is generated as shown in (b) of (D).

The subsequent operation is similar to that of the conventional circuit of FIG. 1. More specifically, the output 4A of the phase comparator 4 is converted to a low frequency signal through the low-pass filter 5 as shown in (E) of FIG. 4, and the low-pass filter output 5A is negatively fed back to the oscillation frequency control terminal of the VCO 3. Thus, the phase lock loop system operates on the basis of the feedback principle so that the phase of the VCO output 3A will converge to such a value that the phase difference between the input and output of the decision circuit 1 becomes half a period. As a result, the VCO output (that is, the timing signal or the clock signal) 3A in synchronization with the input data 1A is obtained. Moreover, since the phases are compared between the input and output of the decision circuit 1, the decision of the input data is always carried out at the optimum point.

The phase lock loop circuit of FIG. 3 is superior to that of FIG. 1 in that it can automatically control the relationship between the input data 6A and the clock signal 3A (that is, it can achieve automatic timing skew adjustment). The circuit, however, still has a problem in that it cannot maintain its stability for input data including consecutive identical bits, because the output of the phase comparator 4 takes a level independent of the phase difference.

FIG. 5 shows results of a circuit simulation about the conventional circuit of FIG. 3. In this figure, the axis of abscissas represents time (nsec), and the axis of ordinates represents voltage, and the waveforms of the output data 7A and the clock signal 3A are illustrated. Enlarged waveforms of sections W1 and W2 in (A) of FIG. 5 are shown in (B) and (C) of FIG. 5, respectively. It is assumed in the circuit simulation that the decision circuit 1 comprises ordinary D flip-flops, the phase comparator 4 is a multiplier type, the low-pass filter 5 is composed of a resistor and a capacitor, and the VCO is a multivibrator type. It is further assumed that the transmission rate of the input data is 2.5 Gb/s, and transistors constituting the circuit are an Si bipolar transistor whose high cutoff frequency is about 30 GHz. The simulation was carried out using the analog simulator program SPICE on a work station.

The output waveforms 7A and 3A illustrate changes caused by 63 consecutive 0s inputted after the phase lock loop system is pulled into the stable state (phase locked state) by the input data consisting of alternate 1s and 0s. If the phase locked state is maintained during this 63 consecutive 0s, 63 clock pulses will be outputted during this interval. Actually, however, 64 clock pulses are generated during the first interval as shown in FIG. 5 Part B, and 69 clock pulses are generated during the third interval as shown in FIG. 5 part C. This indicates that the phase locked state is broken by the consecutive identical bits.

FIG. 6 shows another conventional circuit for recovering data and a time signal (clock signal) without employing a phase lock loop circuit. In this figure, the reference numeral 16 denotes a tuning circuit, and 17 denotes an amplitude limitation amplifier. The other components are the same as those of FIG. 1. The tuning circuit 16 tunes in the clock signal frequency so that it recovers the clock from the input data. The amplitude limitation amplifier 17 outputs a signal of a constant amplitude in spite of changes in the amplitude of the input data.

FIG. 7 shows operational waveforms of the conventional data and timing signal recovery circuit as shown in FIG. 6. This figure illustrates waveforms of the input data 6A, the output data 7A, the output 2A of the doubler 2, the output 16A of the tuning circuit 16, and the output 17A of the amplitude limitation amplifier 17. The operation of the conventional circuit of FIG. 6 will be explained with reference to FIG. 7.

First, the input data 6A is doubled in frequency by the doubler 2. The output 2A of the doubler 2 is passed through the tuning circuit 16, and the clock signal component is recovered as the output 16A. The amplitude limitation amplifier 17 amplifies the output 16A, and outputs the signal 17A whose amplitude is constant as shown in (E) of FIG. 7. The output 17A is used as the clock signal of the decision circuit 1 which carries out the logic detection of the input data 6A. A sufficiently high Q of the tuning circuit 16 makes it possible to maintain the clock signal component even during a consecutive identical bits as shown in (D) of FIG. 7 although the amplitude will be gradually reduced during resonance. Amplifying the output 16A such that its amplitude becomes constant by the amplitude limitation amplifier 17 enables the clock signal to be maintained during the consecutive identical bits.

As the tuning circuit 16 having a high Q of above several thousands, a coaxial resonator or a surface acoustic wave (SAW) filter is generally used, which operates stably for consecutive identical bits of more than 100 bits. Therefore, this circuit is more widely used as the data and timing signal recovery circuit than the above-described two conventional circuits employing a phase lock loop circuit. Considering a monolithic integration of this circuit, however, a new problem arises in that an external component must be used as the tuning circuit 16 because no existing technique can implement a monolithic integration of a high Q circuit. As a result, a fully monolithic integrated circuit cannot be realized, which makes it difficult to provide a small, highly reliable, low cost circuit. Furthermore, all amplitude limitation amplifier 17 of a higher gain is required in order to realize a larger resistance to identical consecutive bits, and this makes it difficult to implement a circuit with stable operation. In particular, there is a problem in that such a circuit becomes more difficult to realize as all increasing resistance to consecutive identical bits at a higher frequency is required.

In summary, the conventional phase lock loop circuit used as the data and timing signal recovery circuit cannot provide a correct phase compared output during a consecutive identical bit interval. This presents a problem in that the increasing number of consecutive identical bits will make the phase lock loop circuit more unstable, and sometimes cause pulling out of synchronism. In addition, a conventional circuit not using a phase lock loop circuit has limits in implementations of a small, highly reliable, low cost circuit because a fully monolithic integrated circuit cannot be realized with such a circuit.

SUMMARY OF THE INVENTION

It is therefore an object of the present invention to provide a phase lock loop circuit using a sample and hold switch circuit, which can be integrated into a fully monolithic integrated circuit, and which can stably maintain the phase locked state for input data including consecutive identical bits of more than several tens of bits.

In a first aspect of the present invention, there is provided a phase lock loop circuit comprising:

- a phase comparator for detecting a phase difference between input data and a comparing signal;
- a control circuit for detecting a consecutive identical bit state of the input data, and for outputting a control signal;
- a sample and hold switch circuit for sampling and holding the output of the phase comparator, and for maintaining a holding mode in response to the control signal supplied from the control circuit while the consecutive identical bit state is being detected;
- a DC (direct current) component detecting means for detecting a DC component of the output of the sample and hold switch circuit; and
- a variable frequency oscillator for generating a signal whose frequency is controlled in accordance with the output of the DC component detecting means, and for supplying the output signal of the variable frequency oscillator to the phase comparator as the comparing signal.

Here, the control circuit may comprise a delay circuit for delaying the input data, and an exclusive OR circuit for performing an exclusive OR operation between the input data and the output of the delay circuit.

The DC component detecting means may be a lowpass filter.

The variable frequency oscillator may be a voltage controlled oscillator.

The phase lock loop circuit may further comprise a frequency multiplier for multiplying the frequency of the input data, wherein the phase comparator detects the phase difference between the comparing signal and the input data whose frequency has been multiplied by the frequency multiplier.

The variable frequency oscillator may comprise a fixed frequency oscillator and a variable phase circuit.

The phase lock loop circuit may be formed into a monolithic integrated circuit.

The phase comparator may comprise a first multiplier for producing a phase difference between the input data and the output of the variable frequency oscillator, a second multiplier for producing a phase difference between the input data whose phase is not delayed and the input data whose phase is delayed by 90 degrees, and a subtracter for subtracting the output of the second multiplier from the output of the first multiplier.

The variable frequency oscillator may comprise a hysteresis comparator, and a delay circuit for delaying the output of the hysteresis comparator in accordance with the DC component fed from the DC component detecting means, and positively feeding the delayed output of the hysteresis comparator back to the input of the hysteresis comparator.

The sample and hold switch circuit may be of a differential type and the DC component detecting means may be a differential type low-pass filter.

The control circuit may comprise a detecting circuit for detecting a DC level of the input data, and an output circuit for producing the control signal that holds the sample and hold switch circuit when the DC level is higher than a predetermined first level, or lower than a predetermined second level which is lower than the first level.

The detecting circuit may be a low-pass filter, and the output circuit comprises an analog-to-digital (A/D) converter that digitizes the output of the low-pass filter and a logic circuit that produces the control signal by comparing the output of the A/D converter with the predetermined first and second levels.

The detecting circuit may be a low-pass filter, and the output circuit may comprise a first comparator for comparing the DC level with the first level, a second comparator for comparing the DC level with the second level, and a NOR circuit that performs a NOR operation between the outputs of the first and second comparators.

The control circuit may comprise a complementary output circuit that outputs a noninverted signal and an inverted signal of the input data, a first peak detecting circuit for detecting a peak value of the noninverted signal, a second peak detecting circuit for detecting a peak value of the inverted signal, and an exclusive OR circuit for performing an exclusive OR operation between the outputs of the first and second peak detecting circuits.

The control circuit may comprise a differentiator circuit for producing a differentiated signal of the input data, a full-wave rectifier for performing a full-wave rectification on the output of the differentiator circuit, and a peak value holding circuit for holding a peak value of the output of the full-wave rectifier for a predetermined time period.

In a second aspect of the present invention, there is provided a phase lock loop circuit comprising:

- a phase comparator for detecting a phase difference between input data and a comparing signal;
- a control circuit for detecting a consecutive identical bit state of the input data, and for outputting a control signal;
- a sample and hold switch circuit for sampling and holding the output of the phase comparator, and for maintaining a holding mode in response to the control signal supplied from the control circuit while the consecutive identical bit state is being detected;
- a DC component detecting means for detecting a DC component of the output of the sample and hold switch circuit;
- a variable frequency oscillator for generating a clock signal whose frequency is controlled in accordance with the output of the DC component detecting means; and
- a functional circuit for providing the output of the variable frequency oscillator with a frequency conversion or a delay to obtain the comparing signal, and for supplying the comparing signal to the phase comparator.

The functional circuit may comprise a first flip-flop and a second flip-flop which are connected in cascade and operate in response to the clock signal fed from the variable frequency oscillator, and the first flip-flop may delay the phase of the input data by substantially ½ bit to produce the comparing signal.

The control circuit may comprise an exclusive OR circuit for performing an exclusive OR operation between the input data and the output of the second flip-flop.

The functional circuit may comprise a flip-flop and a delay circuit which are connected in cascade, and the flip-flop may delay the phase of the input data by substantially ½ bit in response to a clock signal fed from the variable frequency oscillator to produce the comparing signal, and may supply the comparing signal to the phase comparator.

The control circuit may comprise an exclusive OR circuit for performing an exclusive OR operation between the input data and the output of the delay circuit.

In a third aspect of the present invention, there is provided a signal processing circuit comprising:

a phase comparator for detecting a phase difference between input data and a comparing signal;

a control circuit for detecting a consecutive identical bit state of the input data, and for outputting a control signal;

a sample and hold switch circuit for sampling and holding the output of the phase comparator, and for maintaining in response to the control signal supplied from the control circuit a holding mode while the consecutive identical bit state is being detected;

a DC component detecting means for detecting a DC component of the output of the sample and hold switch circuit;

a variable frequency oscillator for generating a signal whose frequency is controlled in accordance with the output of the DC component detecting means; and a functional circuit for processing the input data, for providing the output of the variable frequency oscillator with a frequency conversion or a delay to obtain the comparing signal, and for supplying the comparing signal to the phase comparator.

The functional circuit may be a circuit that recovers the input data.

The input data may be an amplitude modulations (AM) signal, and the functional circuit may comprise a multiplier for multiplying the AM modulation signal by the output of the variable frequency oscillator, and a delay circuit for delaying the output of the variable frequency oscillator and for feeding the delayed output back to the phase comparator as the comparing signal.

The input data may be a reference signal, and the functional circuit may comprise a frequency divider for dividing the output frequency of the variable frequency oscillator, and for feeding the output whose frequency may be divided back to the phase comparator as the comparing signal.

According to the present invention, the output of the phase comparator is passed through the sample and hold switch circuit so that the oscillation frequency of the variable frequency oscillator is controlled by the output of the sample and hold switch circuit that samples the output of the phase comparator during the alternate 0s and 1s state of the input data, but holds the output of the phase comparator during the consecutive identical bit state.

The present invention, for example, detects the consecutive identical bit state by performing the exclusive OR operation between the input data and the delayed input data, and so on. Thus, the sample and hold switch circuit is automatically controlled to maintain the off state (holding mode) during the consecutive identical bit state.

The present invention differs from the conventional techniques in that it includes a sample and hold switch circuit in the phase lock loop, and turns on and off the sample and hold switch circuit in response to the consecutive identical bit state. As the variable frequency oscillator, a VCO (Voltage Controlled Oscillator), or a current controlled oscillator can be employed.

According to the present invention, the phase locked state can be maintained by controlling the sample and hold switch circuit in response to input data including the consecutive 0s or 1s. In addition, since no external component part is required, a fully monolithic integrated circuit can be implemented, which serves to provide a small, highly reliable, low cost circuit.

The above and other objects, effects, features and advantages of the present invention will become more apparent from the following description of the embodiments thereof taken in conjunction with the accompanying drawings.

BRIEF DESCRIPTION OF THE DRAWINGS

FIG. 22C is a table comparing characteristics of the eighth embodiment with those of a conventional phase lock loop circuit;

DETAILED DESCRIPTION OF PREFERRED EMBODIMENTS

The invention will now be described with reference to the accompanying drawings.

EMBODIMENT 1

Figure 1:
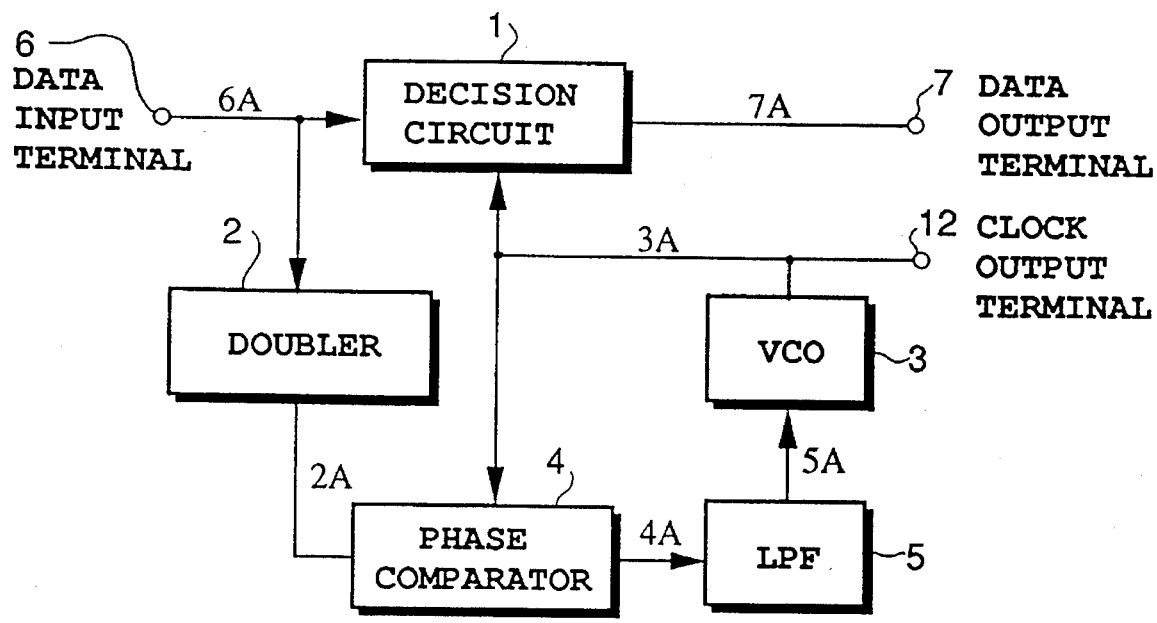
FIG. 1 is a block diagram showing a conventional data and timing signal recovery circuit using a conventional phase lock loop circuit.
Figure 2:
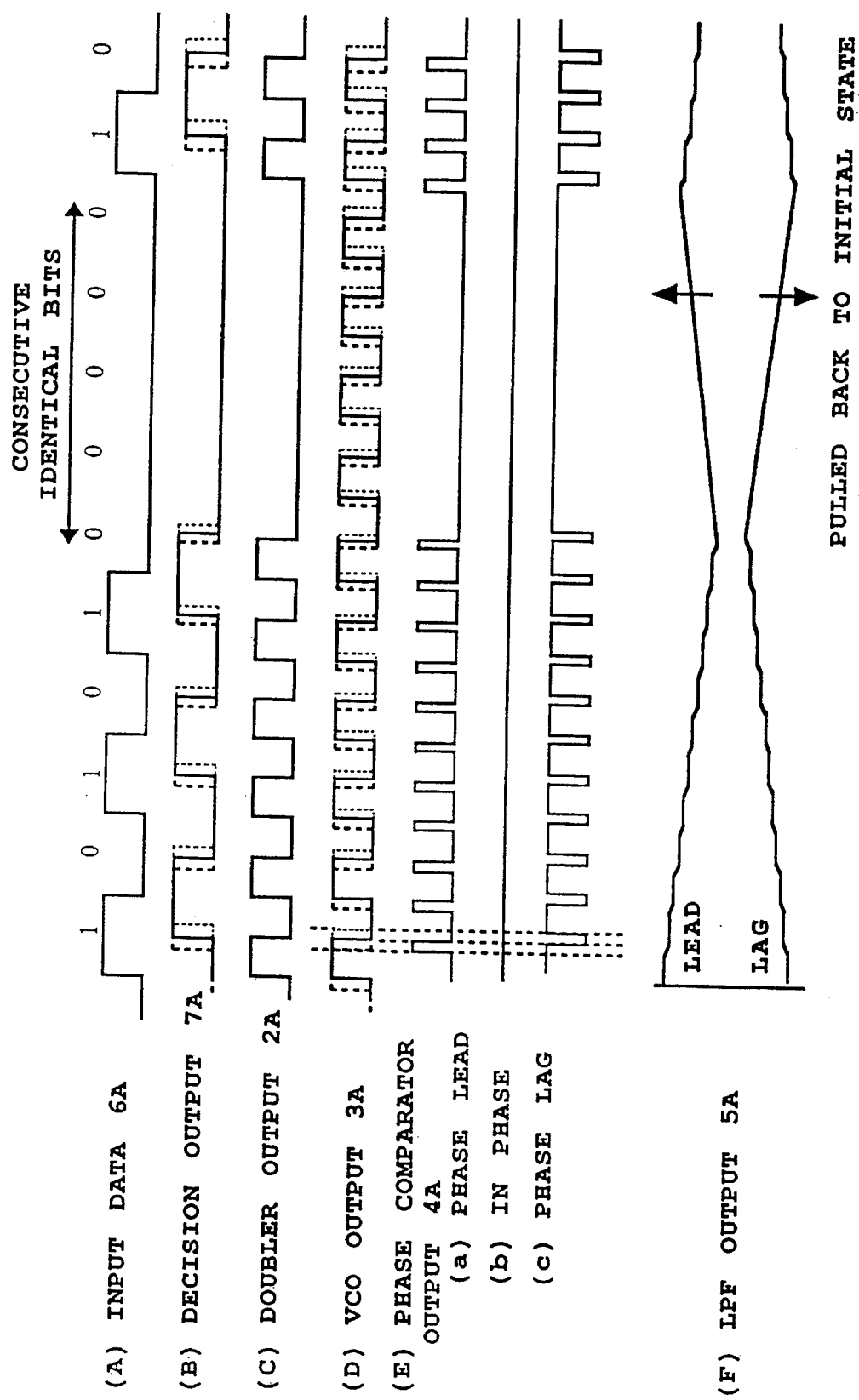
FIG. 2 is a diagram illustrating operational waveforms of the conventional circuit as shown in FIG. 1.
Figure 8:
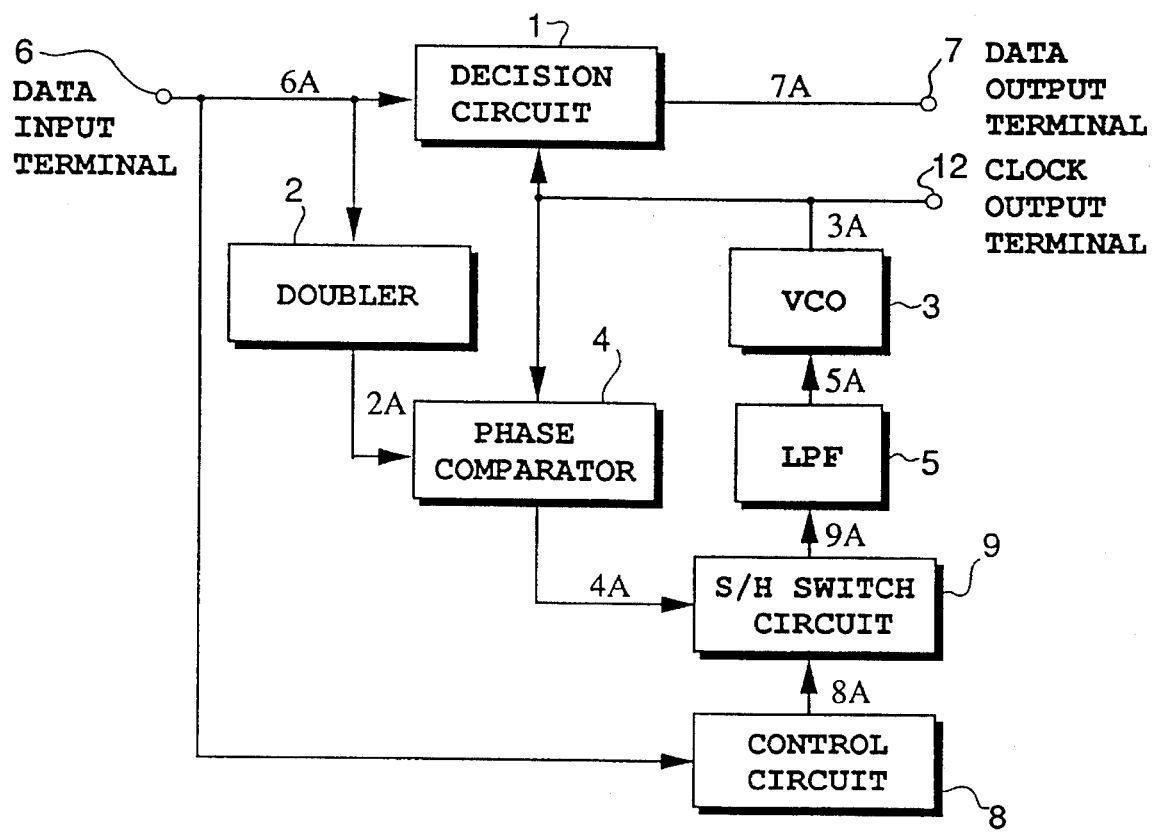
FIG. 8 is a block diagram showing a first embodiment of a phase lock loop circuit in accordance with the present invention, which is applied to a data and timing signal recovery circuit.

FIG. 8 is a block diagram showing a first embodiment of a data and timing signal (clock signal) recovery circuit, to which the phase lock loop circuit in accordance with the present invention is applied. In this figure, the reference numeral 1 designates the decision circuit of the input data, 2 designates the doubler, 3 designates the VCO (Voltage Controlled Oscillator), 4 designates the phase comparator, 5 designates the low-pass filter, 6 designates the data input terminal, 7 designates the data output terminal, 8 designates a control circuit that provides a sample and hold switch circuit with an S/H control signal 8A, 9 designates the sample and hold switch circuit, and 12 designates the clock signal output terminal. This embodiment differs from the conventional circuit in FIG. 1 in that it includes the control circuit 8, and the sample and hold switch circuit 9 which is turned on and off by the S/H control signal fed from the control circuit 8. Incidentally, the term "sample and hold switch circuit" used throughout the specification and claims of the present application refers to an ordinary "sample and hold circuit".

Figure 9:
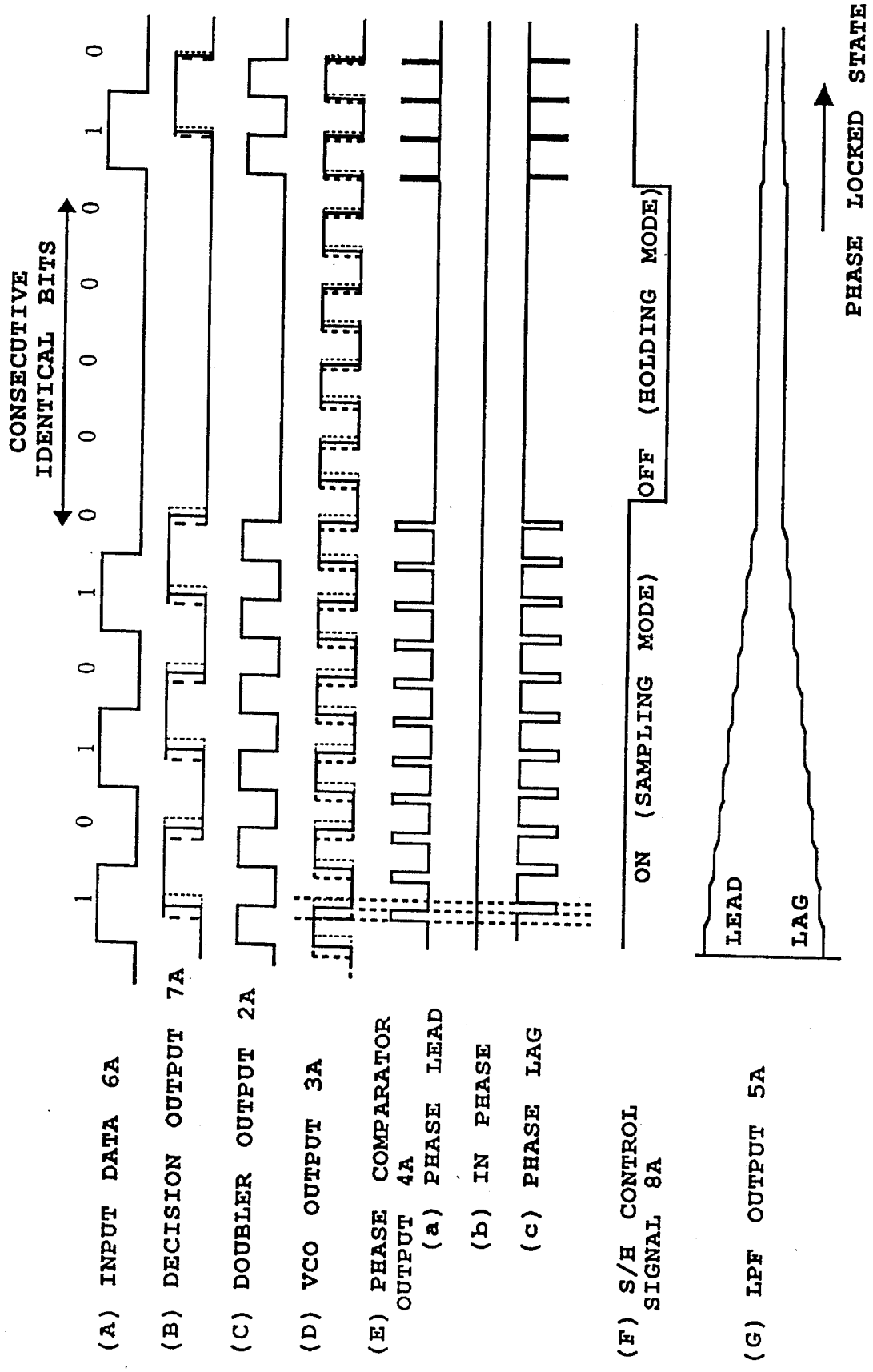
FIG. 9 is a diagram illustrating operational waveforms of the first embodiment as shown in FIG. 8.

FIG. 9 schematically illustrates operational waveforms of various portions of the phase lock process of the circuit as shown in FIG. 8. This figure shows waveforms of the input data 6A, the output data 7A provided by the decision circuit 1 and outputted from the data output terminal 7, the doubler output 2A produced from the doubler 2, the VCO output 3A produced from the VCO 3, which is further outputted from the clock signal output terminal 12, the phase compared output 4A produced from the phase comparator 4, the S/H (Sample and Hold) control signal 8A which is supplied from the control circuit 8 to the sample and hold switch circuit 9, and the low-pass filter output 5A produced from the low-pass filter 5 in (A)–(G), respectively. The compared output 4A is further illustrated in terms of (a) phase lead, (b) in phase, and (c) phase lag.

The present invention is characterized in that the sample and hold switch circuit 9 maintains the off state, that is, the holding mode, while the consecutive identical bit state is being detected, so that the transmission of the output 4A from the phase comparator 4 to the low-pass filter 5 is stopped, and thus the low-pass filter 5 maintains its output state at the instant when the sample and hold switch circuit 9 enters into the off state. More specifically, the control circuit 8 detects the consecutive identical bit state on the basis of the input data, and supplies the S/H control signal 8A to the sample and hold switch circuit 9. By this, the sample and hold switch circuit 9 is maintained at all off state (holding mode) during the consecutive identical bit state, whereas it is kept on during the remaining portions, as shown in FIG. 9. As a result, the VCO 3 maintains its oscillation frequency during the consecutive identical bit state, so that the phase difference between the VCO output 3A and the doubler output 2A is also maintained. Accordingly, the circuit of the present embodiment can maintain the phase locked state even when the input data including the consecutive identical bits is applied. A maximum duration of maintaining the phase locked state for the consecutive identical bits is determined by the performance of the sample and hold switch circuit 9. For example, the phase locked state can be readily maintained during consecutive identical bits of more than several tens of bits because the effect of the output of the phase comparator is eliminated during this interval.

EMBODIMENT 2

Figure 10:
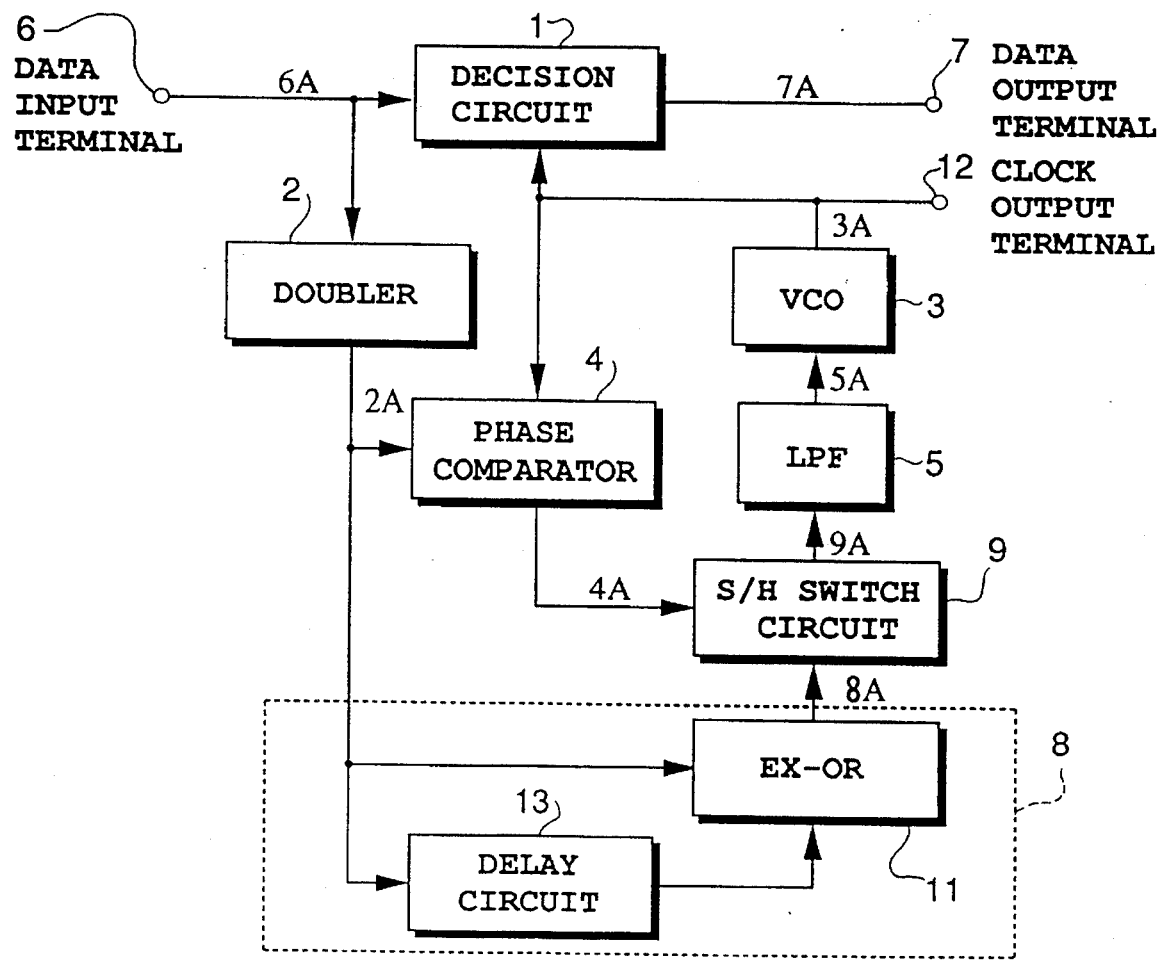
FIG. 10 is a block diagram showing a second embodiment of a phase lock loop circuit in accordance with the present invention, which is applied to a data and timing signal recovery circuit.

FIG. 10 shows a second embodiment of the phase lock loop circuit in accordance with the present invention, which is applied to a data and clock signal recovery circuit. In this embodiment, the control circuit 8 is composed of an exclusive OR circuit 11 and a delay circuit 13 that provides the doubler output 2A with a delay of approximately 1 bit, and the S/H control signal 8A is generated from the exclusive OR circuit 11 that performs the exclusive OR operation between the doubler output 2A and the output of the delay circuit 13.

EMBODIMENT 3

Figure 3:
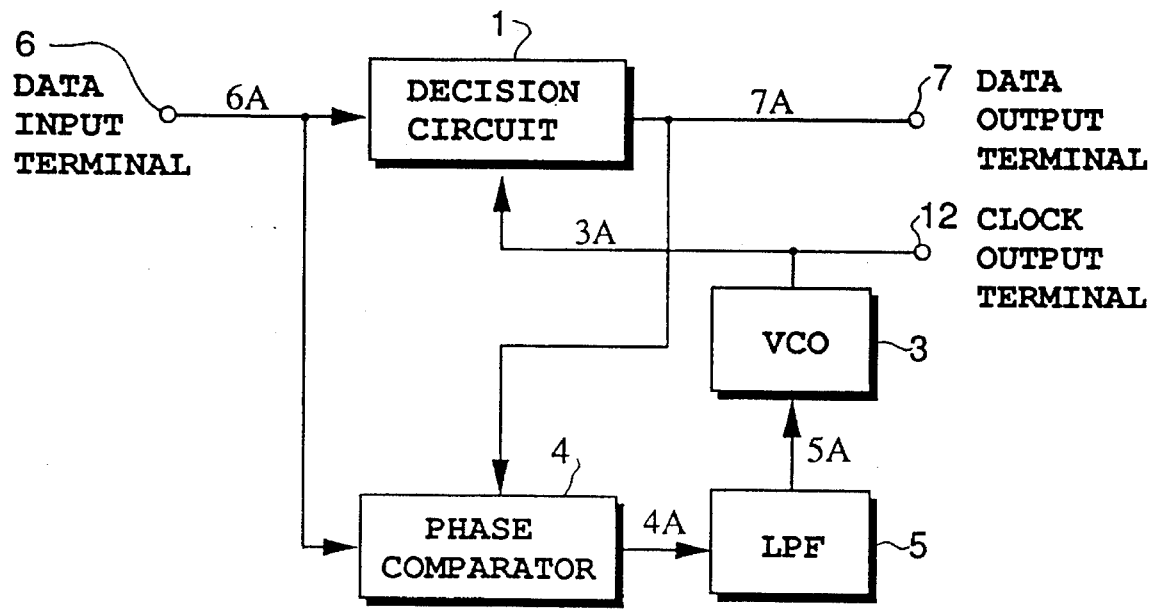
FIG. 3 is a block diagram showing another conventional data and timing signal recovery circuit using a conventional phase lock loop circuit.
Figure 4:
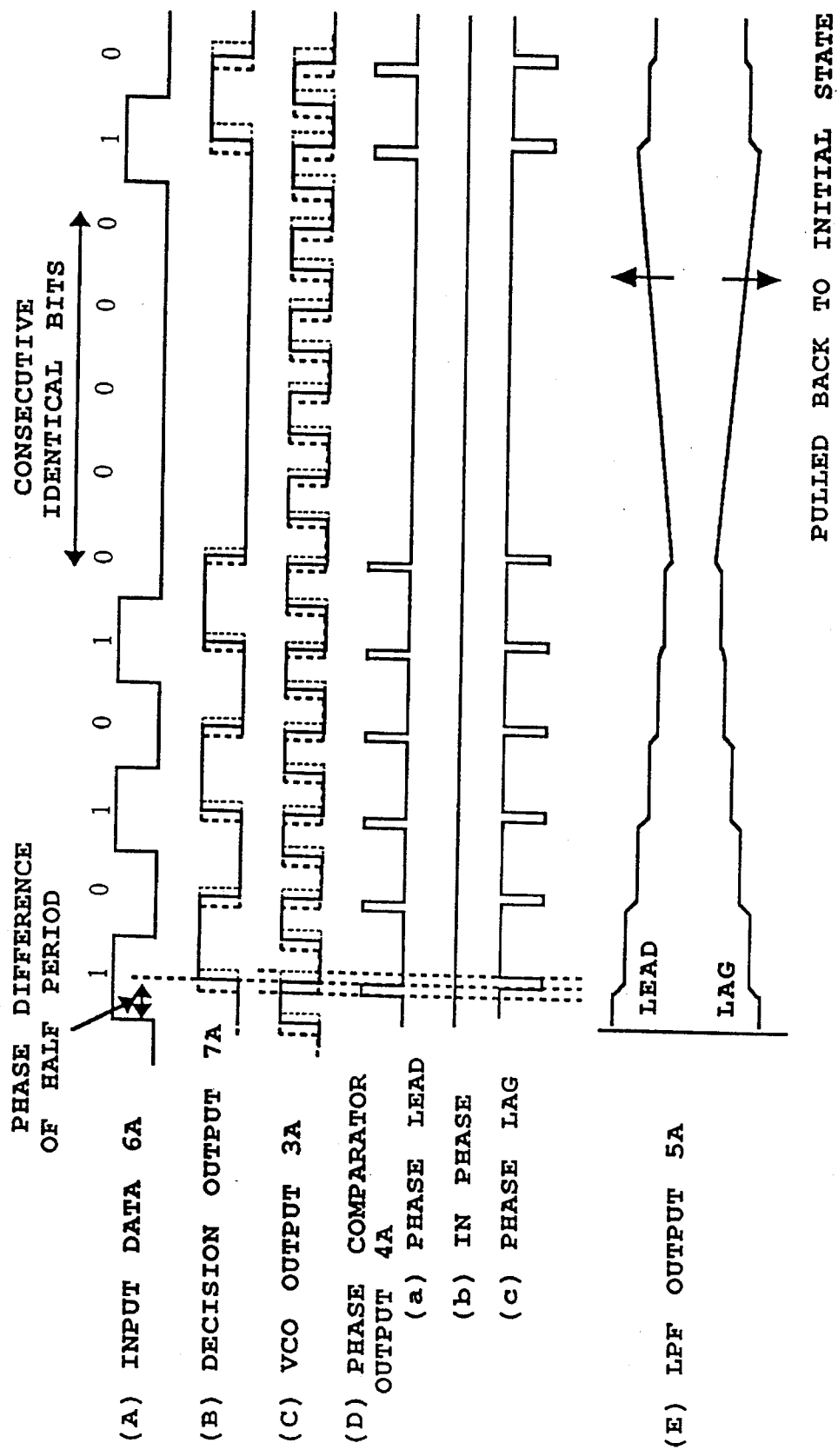
FIG. 4 is a diagram illustrating operational waveforms of the conventional circuit as shown in FIG. 3.
Figure 5:
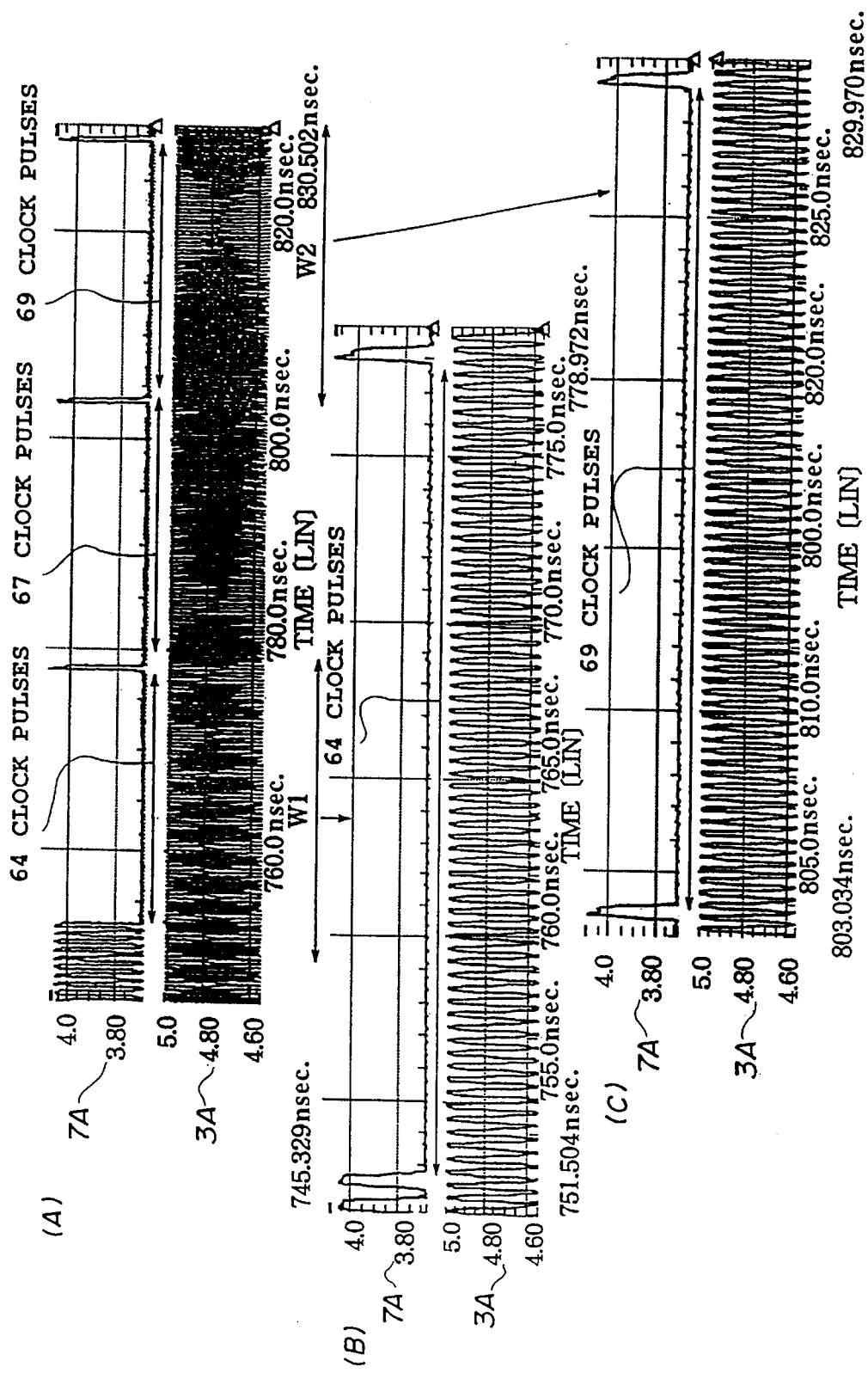
FIG. 5 is a diagram illustrating results of a simulation of the outputs of the conventional circuit of FIG. 3.
Figure 6:
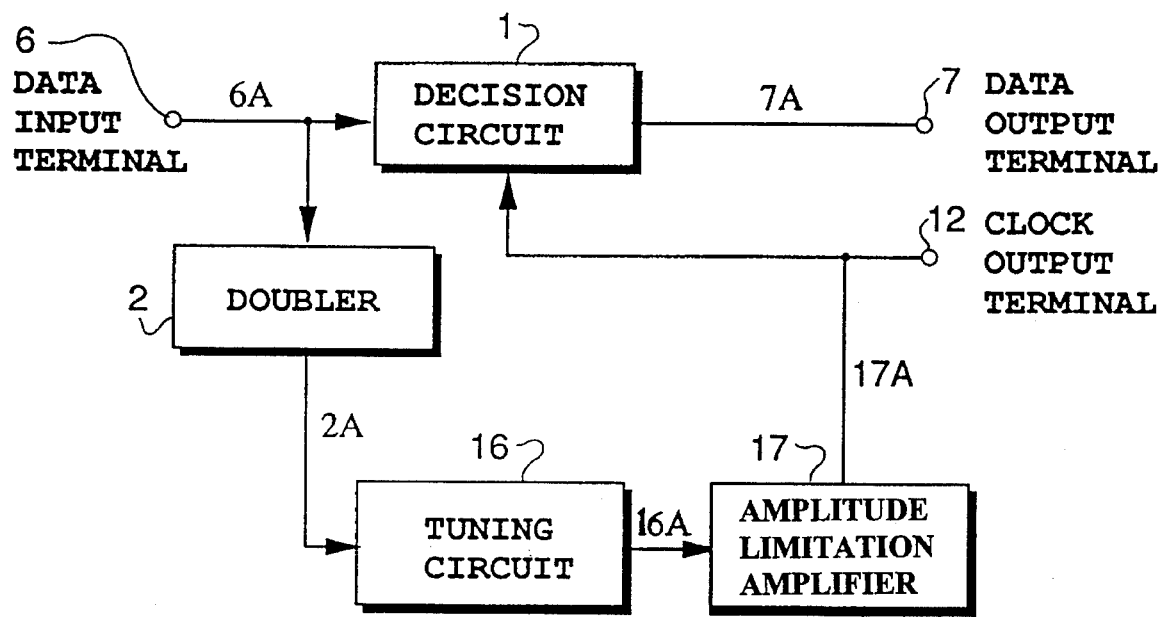
FIG. 6 is a block diagram showing a conventional data and timing signal recovery circuit without using a phase lock loop circuit.
Figure 7:
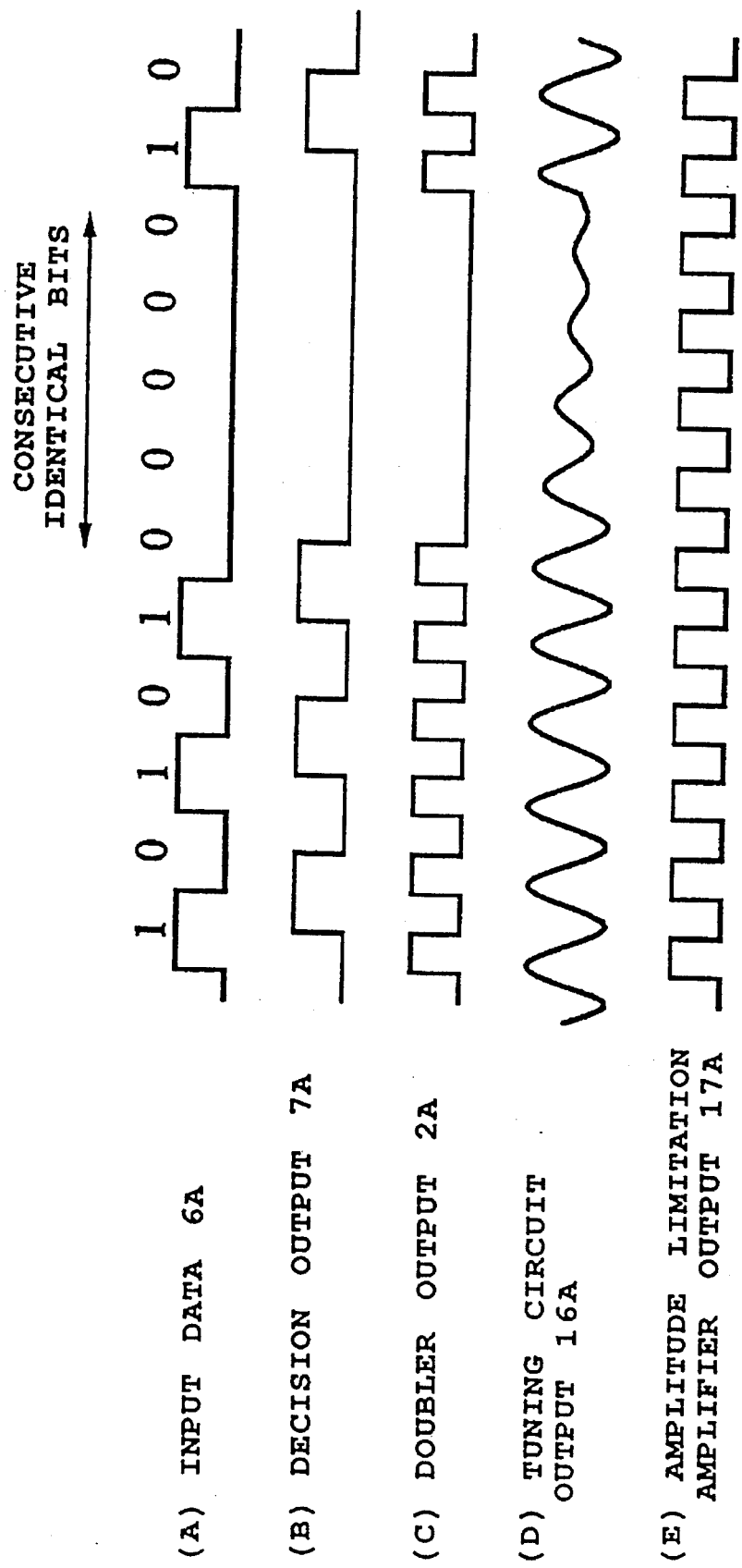
FIG. 7 is a diagram illustrating operational waveforms of the conventional circuit as shown in FIG. 6.
Figure 11:
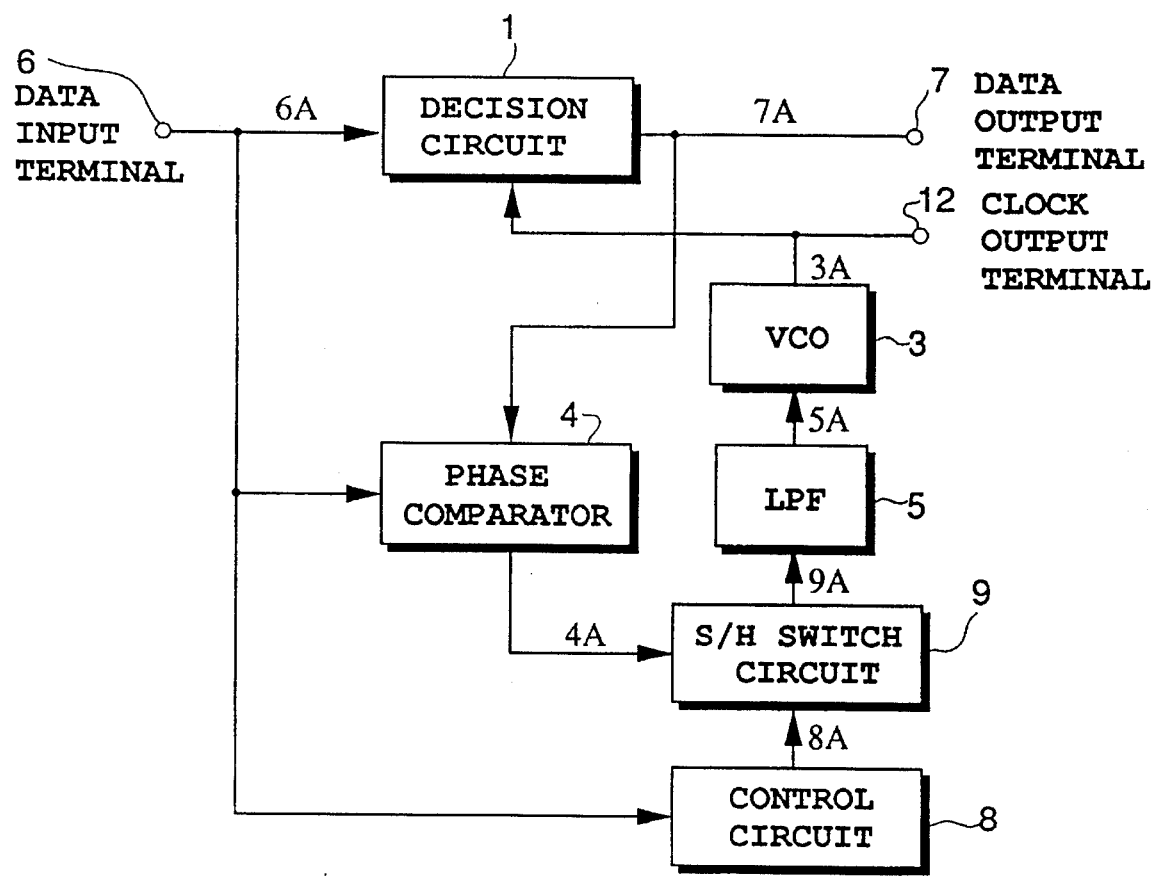
FIG. 11 is a block diagram showing a third embodiment of a phase lock loop circuit in accordance with the present invention, which is applied to a data and timing signal recovery circuit.

FIG. 11 shows a third embodiment of the phase lock loop circuit in accordance with the present invention, which is applied to a data and clock signal recovery circuit. This embodiment differs from the conventional circuit as shown in FIG. 3 in that it includes the sample and hold switch circuit 9 interposed between the phase comparator 4 and the low-pass filter 5, and includes control circuit 8 that provides the sample and hold switch circuit 9 with the S/H control signal which turns on and off the sample and hold switch circuit 9.

Figure 12:
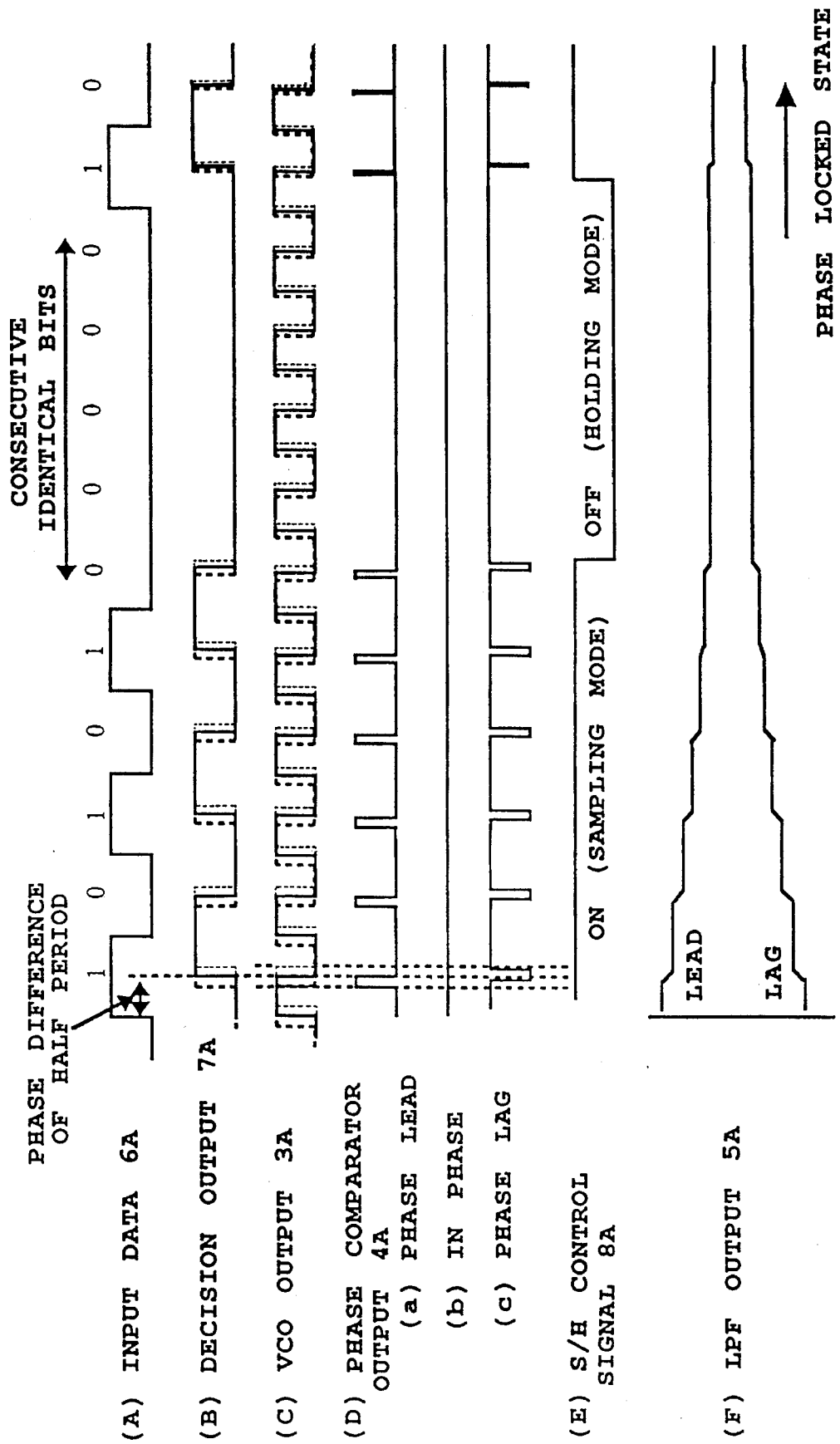
FIG. 12 is a diagram illustrating operational waveforms of the third embodiment as shown in FIG. 11.

FIG. 12 schematically illustrates operational waveforms of various portions associated with the phase lock process of the third embodiment of FIG. 11. The present embodiment is characterized in that it keeps the sample and hold switch circuit 9 in all off state (holding mode), when the consecutive identical bit state is detected, to prevent the output of the phase comparator 4 from being transmitted to the low-pass filter 5, and to maintain the output condition of the low-pass filter 5 at the state at the instant when the sample and hold switch circuit 9 is turned off. As a result, the oscillation frequency of the VCO 3 is maintained at a constant value even during the consecutive identical bit state, and hence the phase difference between the input and output of the decision circuit 1 is kept constant. Thus, the phase locked state is maintained even if the input data including consecutive identical bits is applied, as in the first embodiment as shown in FIG. 8. Moreover, the embodiment has an advantage over the first embodiment in that the data detection by the decision circuit 1 is always carried out at the optimum point. This is because the phase comparing operation is performed in such a manner that the phase difference between the input and output data of the decision circuit 1 becomes optimum.

EMBODIMENT 4

Figure 13:
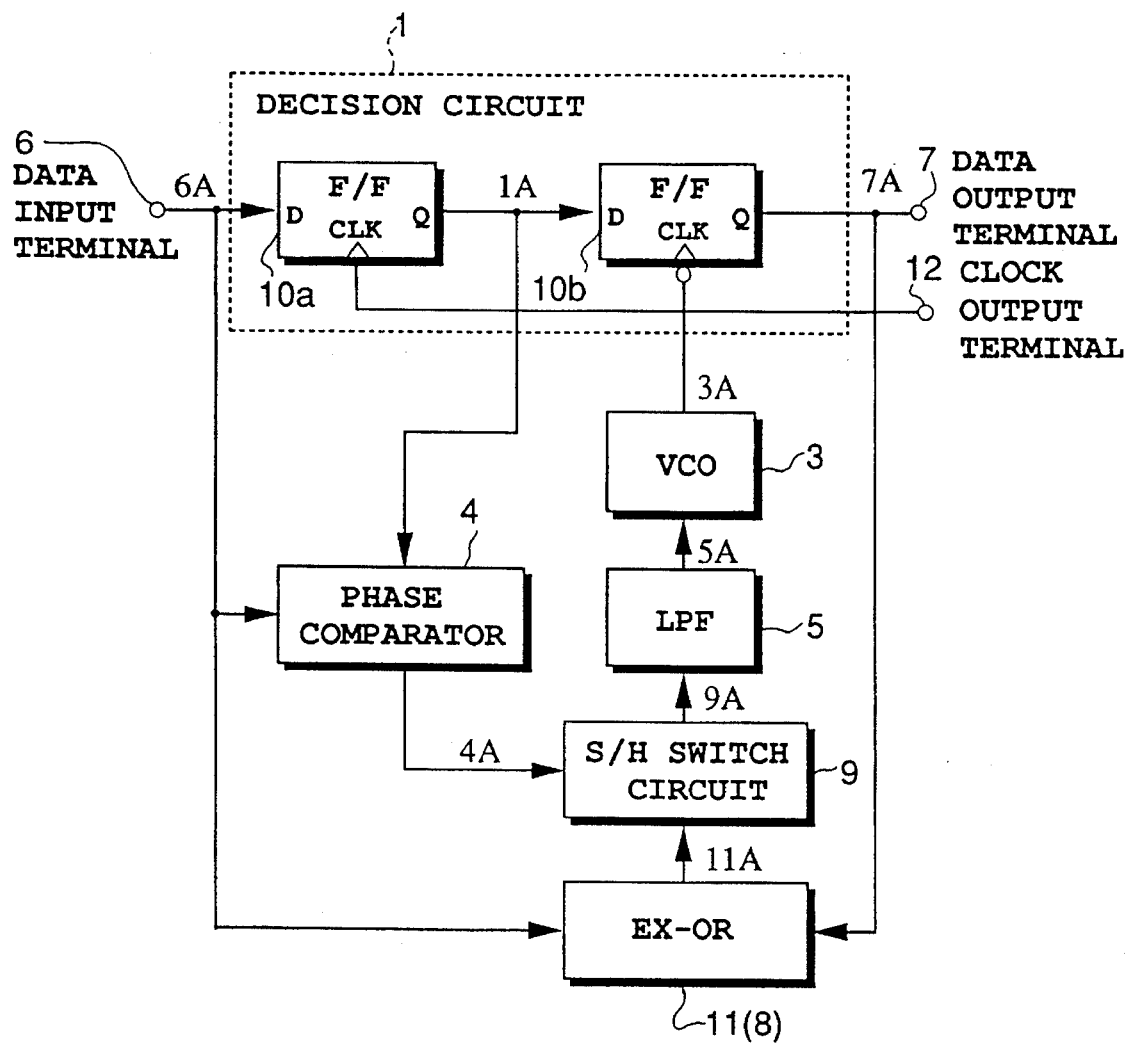
FIG. 13 is a block diagram showing a fourth embodiment of a phase lock loop circuit in accordance with the present invention, which is applied to a data and timing signal recovery circuit.

FIG. 13 shows a fourth embodiment of the phase lock loop circuit in accordance with the present invention, which is applied to a data and clock signal recovery circuit. In this embodiment, the decision circuit 1 of the third embodiment as shown in FIG. 11 is replaced with a decision circuit including two flip-flops 10a and 10b connected in cascade, and the exclusive OR circuit 11 is employed as the control circuit 8.

Figure 14:
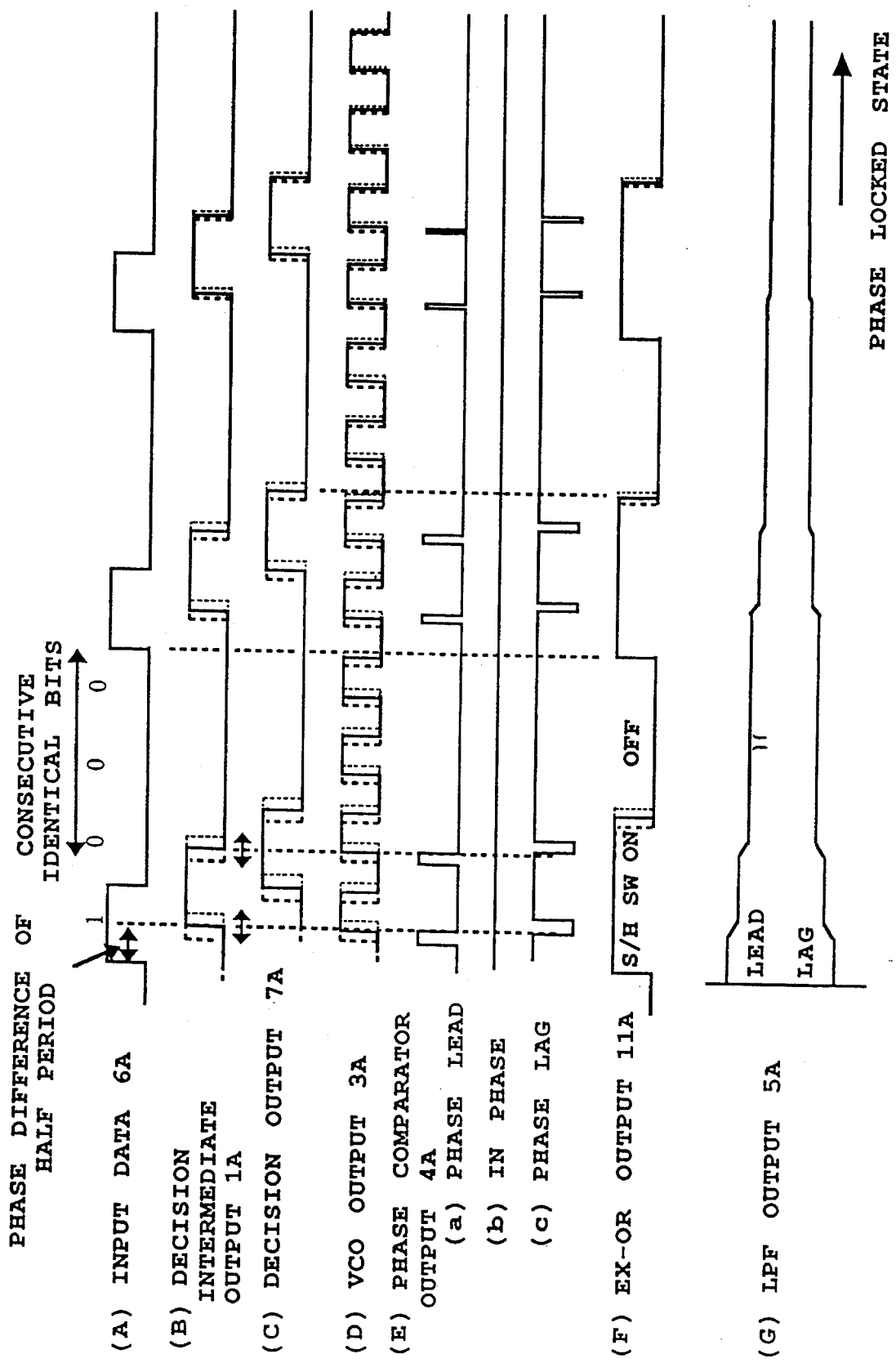
FIG. 14 is a diagram illustrating operational waveforms of the fourth embodiment as shown in FIG. 13.

FIG. 14 schematically illustrates operational waveforms of various portions associated with the phase lock process of the fourth embodiment as shown in FIG. 13. In this figure, the output of the flip-flop 10a, that is, the intermediate output 1A of the decision circuit 1, and the exclusive OR output 11A of the exclusive OR circuit 11, which controls the sample and hold switch circuit 9, are shown in addition to the signals 6A, 7A, 3A, 4A, and 5A of FIG. 12. This embodiment is characterized in that it uses the exclusive OR between the input data 6A and the output 7A of the decision circuit 1 as the S/H control signal for the sample and hold switch circuit 9. With this configuration, the sample and hold switch circuit 9 is maintained at all on state (sampling mode) while the phase comparator 4 produces a correct output, and is maintained at all off state (holding mode) during the consecutive identical bit state, by the exclusive OR output 11A fed from the exclusive OR circuit 11.

Figure 15:
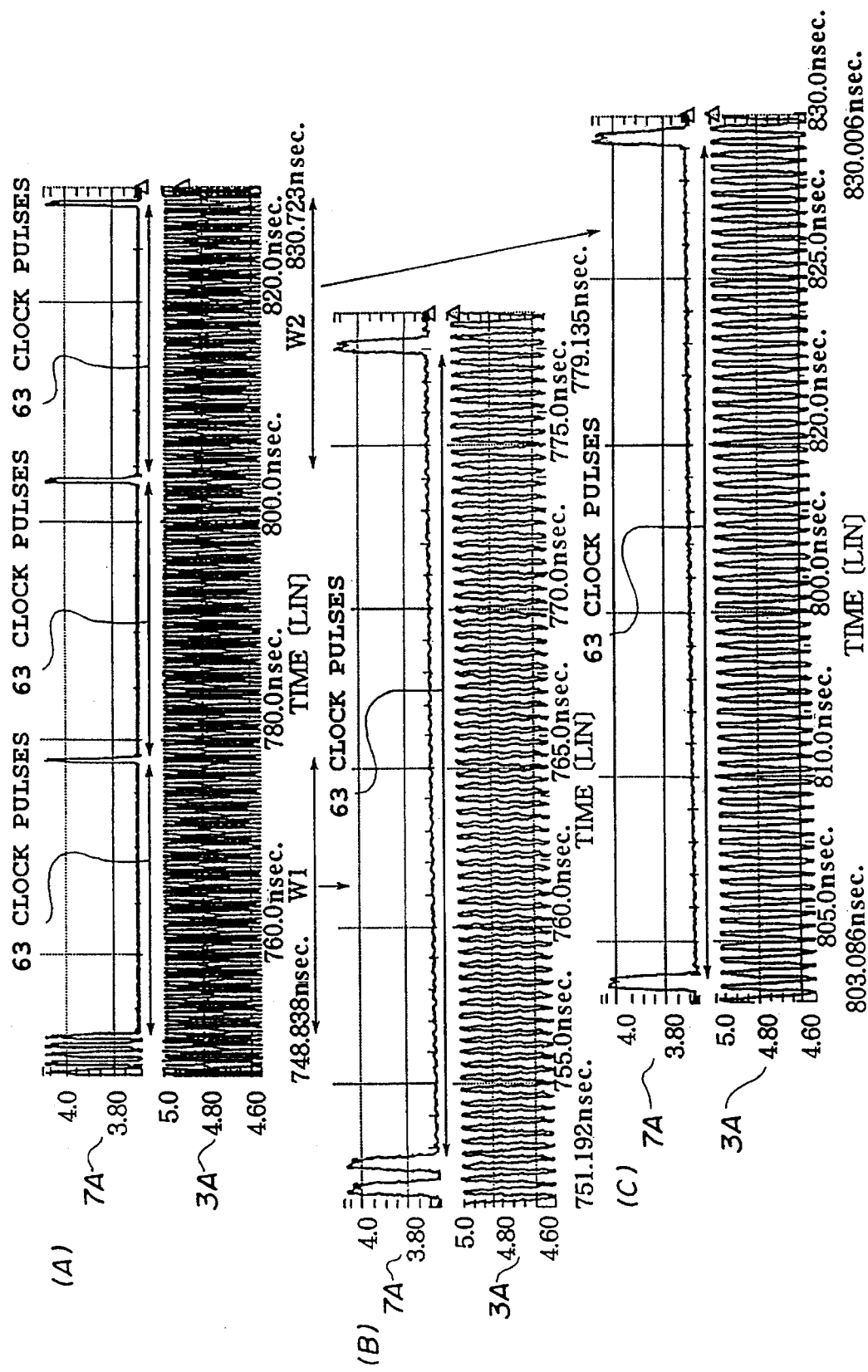
FIG. 15 is a diagram illustrating results of a simulation of the output waveforms of the fourth embodiment as shown in FIG. 13.

FIG. 15 shows results of a circuit simulation of the fourth embodiment of FIG. 13. In this figure, the axis of abscissas represents time (nsec), and the axis of ordinates represents voltage, and the waveforms of the output data 7A and the clock signal 3A are illustrated. Enlarged waveforms of sections W1 and W2 in (A) of FIG. 15 are shown in (B) and (C) of FIG. 15, respectively. It is assumed in the circuit simulation that the decision circuit 1 comprises ordinary D flip-flops connected in cascade, the phase comparator 4 is a multiplier type, the low-pass filter 5 is composed of a resistor and a capacitor, and the VCO is a multivibrator type. It is further assumed that the exclusive OR circuit 11 is a differential type, and the sample and hold switch circuit 9 is also a differential type, in which a large on/off ratio can be established. This simulation was carried out under the same conditions as the simulation of the conventional circuit of FIG. 3 except for the new elements added in this embodiment, and the common portions have the same circuit parameters. In addition, the transmission rate of the input data, and other conditions are set identical to those of the simulation of the conventional circuit. The simulation was carried out using the analog simulator Program SPICE on a work station.

The output waveforms 7A and 3A of FIG. 15 illustrate a state caused by 63 consecutive 0s input after the phase lock loop system is pulled into the stable state (phase locked state) by the input data consisting of alternate 1s and 0s. If the phase locked state is maintained during this 63 consecutive 0s, 63 clock pulses should be outputted during this interval. As shown in FIG. 15, exactly 63 clock pulses are generated during the first and third intervals, which means that the phase locked state is maintained in spite of the consecutive identical bits. Although the number of maximum consecutive identical bits, against which the phase locked state can be maintained, will depend on the performance of the sample and hold switch circuit 9, such as the on/off ratio thereof, the input impedance of the VCO 3, or the like, resistance to consecutive identical bits of more than several tens of bits can be easily established even if a common sample and hold switch circuit and a common VCO are employed.

EMBODIMENT 5

Figure 16:
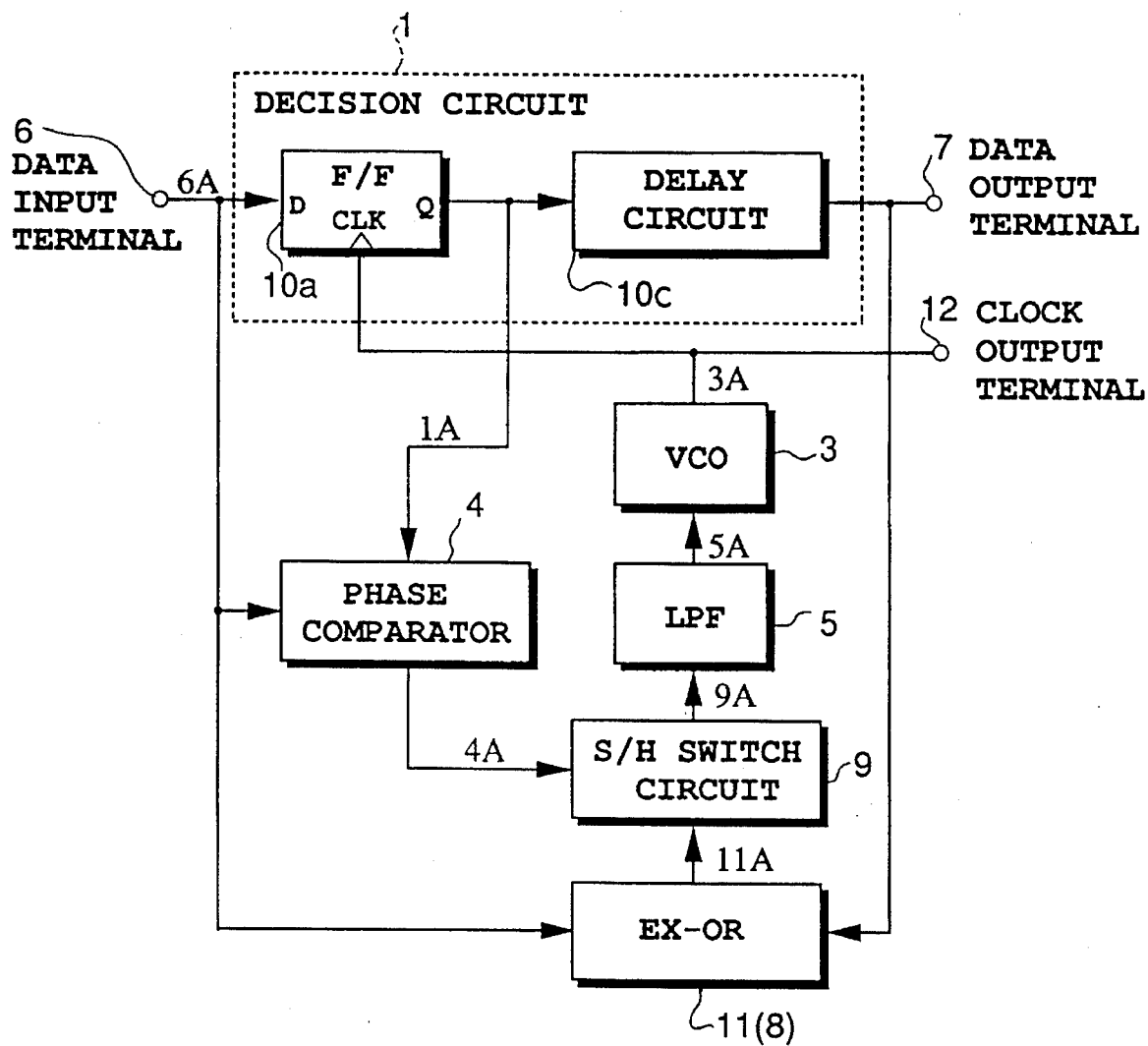
FIG. 16 is a block diagram showing a fifth embodiment of a phase lock loop circuit in accordance with the present invention, which is applied to a data and timing signal recovery circuit.

FIG. 16 shows a fifth embodiment of the phase lock loop circuit in accordance with the present invention, which is applied to a data and clock signal recovery circuit. This embodiment is a modification of the fourth embodiment as shown in FIG. 13. The fourth embodiment of FIG. 13 delays the input data by 1 bit using the flip-flops 10a and 10b connected in cascade, and generates the S/H control signal 11A by performing the exclusive OR operation between the 1 bit delayed signal 7A and the input data 6A. In contrast, in the fifth embodiment of FIG. 16, the second flip-flop 10b of the decision circuit 1 is replaced with a delay circuit 10c which compensates for the propagation delay of the flip-flop 10a and the phase comparator 4. Although the delay of a single flip-flop is 0.5 bit in an ideal case, it increases to 0.5 bit $+\alpha$ in an actual circuit owing to the propagation delay of transistors, and the like. In particular, the ratio of $\alpha$ increases with the increase in the speed of the circuit. In the circuit of FIG. 16, the delay time of the delay circuit 10c is set at $0.5-\alpha$ to compensate for the propagation delay. The delay $\alpha$ includes the propagation delay associated with the phase comparator and the like, in addition to that of the flip-flop 10a.

EMBODIMENT 6

Figure 17:
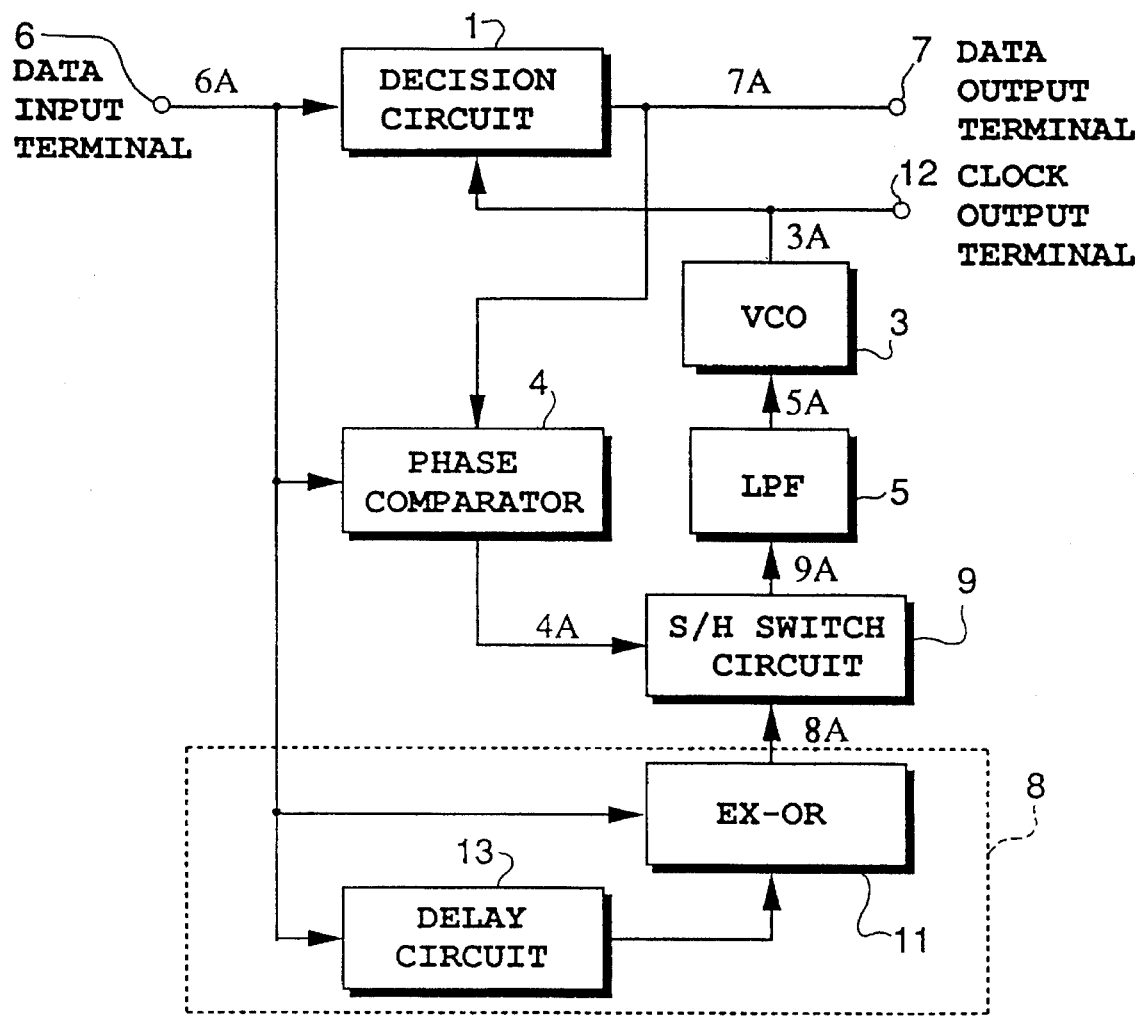
FIG. 17 is a block diagram showing a sixth embodiment of a phase lock loop circuit in accordance with the present invention, which is applied to a data and timing signal recovery circuit.

FIG. 17 shows a sixth embodiment of the phase lock loop circuit in accordance with the present invention, which is applied to a data and clock signal recovery circuit. This embodiment differs from the fifth embodiment as shown in FIG. 16 in that a delay circuit 13 is interposed between the data input terminal 6 and the exclusive OR circuit 11, and the exclusive OR circuit 11 performs the exclusive OR operation between the input data 6A and the output from the delay circuit 13. The exclusive OR circuit 11 and the delay circuit 13 constitute the control circuit 8. The decision circuit 1 includes a flip-flop. The delay circuit 13 of this embodiment provides the input data 6A with a delay of $(1+\alpha)$ bits, thereby compensating for the propagation delay of the flip-flop and the phase comparator by the delay of $\alpha$ as in the fifth embodiment as shown in FIG. 16.

EMBODIMENT 7

Figure 18:
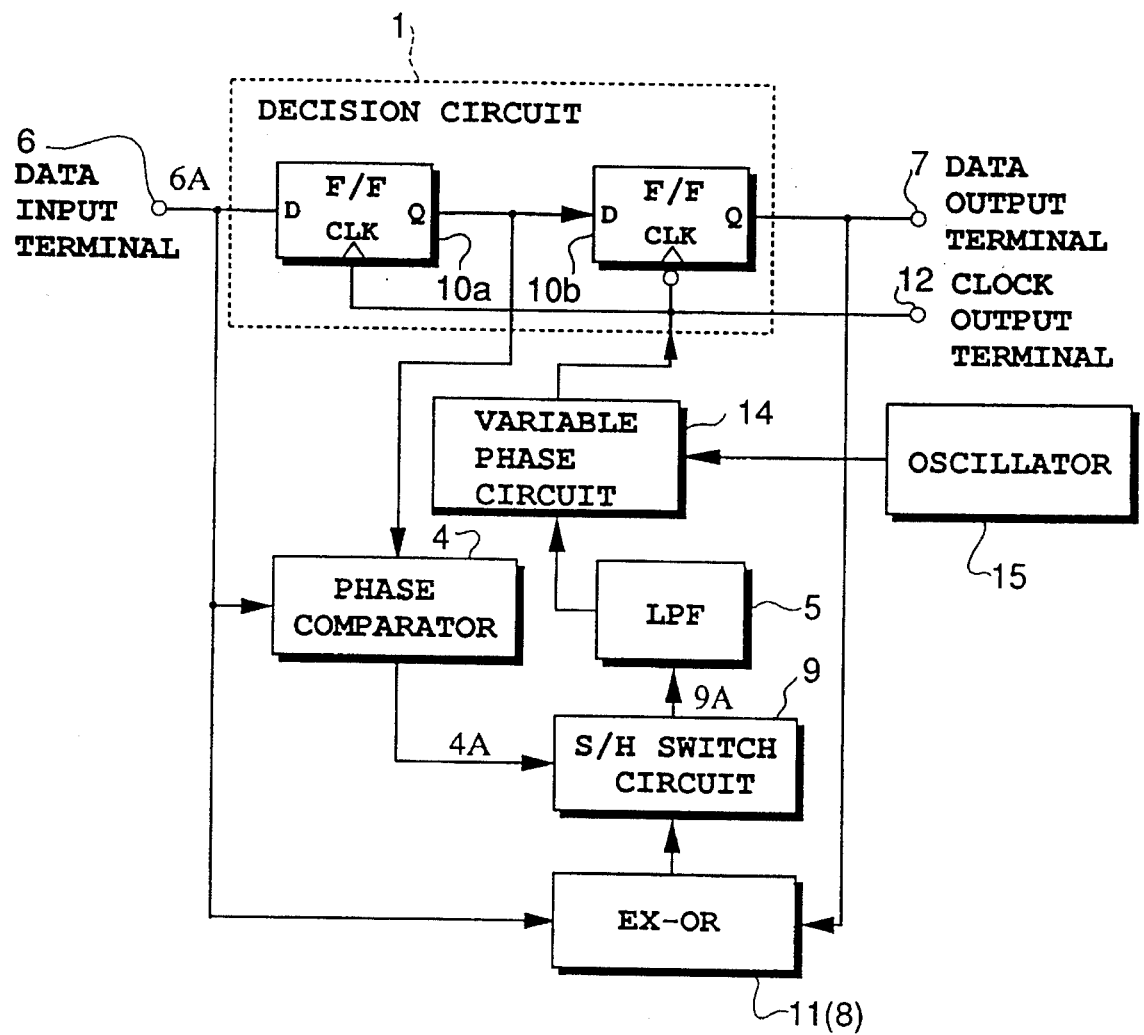
FIG. 18 is a block diagram showing a seventh embodiment of a phase lock loop circuit in accordance with the present invention, which is applied to a data and timing signal recovery circuit.

FIG. 18 shows a seventh embodiment of the phase lock loop circuit in accordance with the present invention, which is applied to a data and clock signal recovery circuit. This embodiment includes a variable phase circuit 14 and a fixed frequency oscillator 15 in place of the VCO 3 of the fourth embodiment of FIG. 13, so that it can be applied to an automatic skew control circuit. The variable phase circuit 14 provides the input signal fed from the oscillator 15 with a phase lead or a phase lag in accordance with the control signal applied from the low-pass filter 5. In this embodiment, the phase difference between the input and output of the first flip-flop 10a is kept constant, which means that the phase difference between the signal (clock signal) output from the variable phase circuit 14 and the input data is kept constant.

Although the frequency of the clock signal changes in the VCO 3 of the fourth embodiment as shown in FIG. 13, the phase of the clock signal changes in the variable phase circuit 14 of this embodiment. However, both the VCO 3 and the variable phase circuit 14 operate in such a manner that the phase difference between the input data and the clock signal is maintained, and hence the operation and effect of this embodiment are similar to those of the fourth embodiment of FIG. 13. The other embodiments 1–8 can also be applied to an automatic skew control circuit, which automatically adjusts timing between the data and the clock, by replacing the VCO 3 with the variable phase circuit 14 and the fixed frequency oscillator 15.

EMBODIMENT 8

Figure 19:
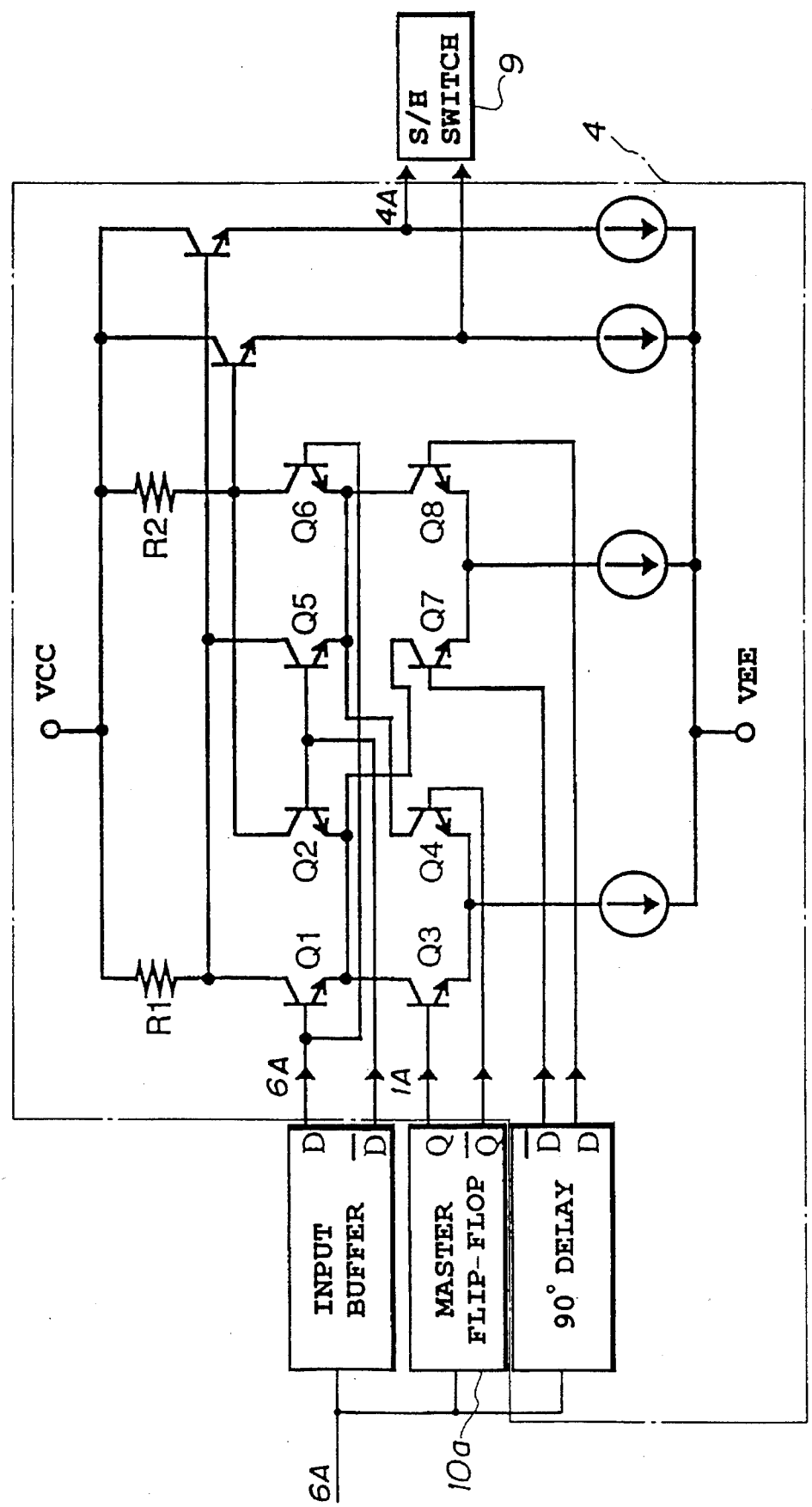
FIG. 19 is a circuit diagram showing a phase comparator of an eighth embodiment of the phase lock loop circuit in accordance with the present invention.
Figure 20:
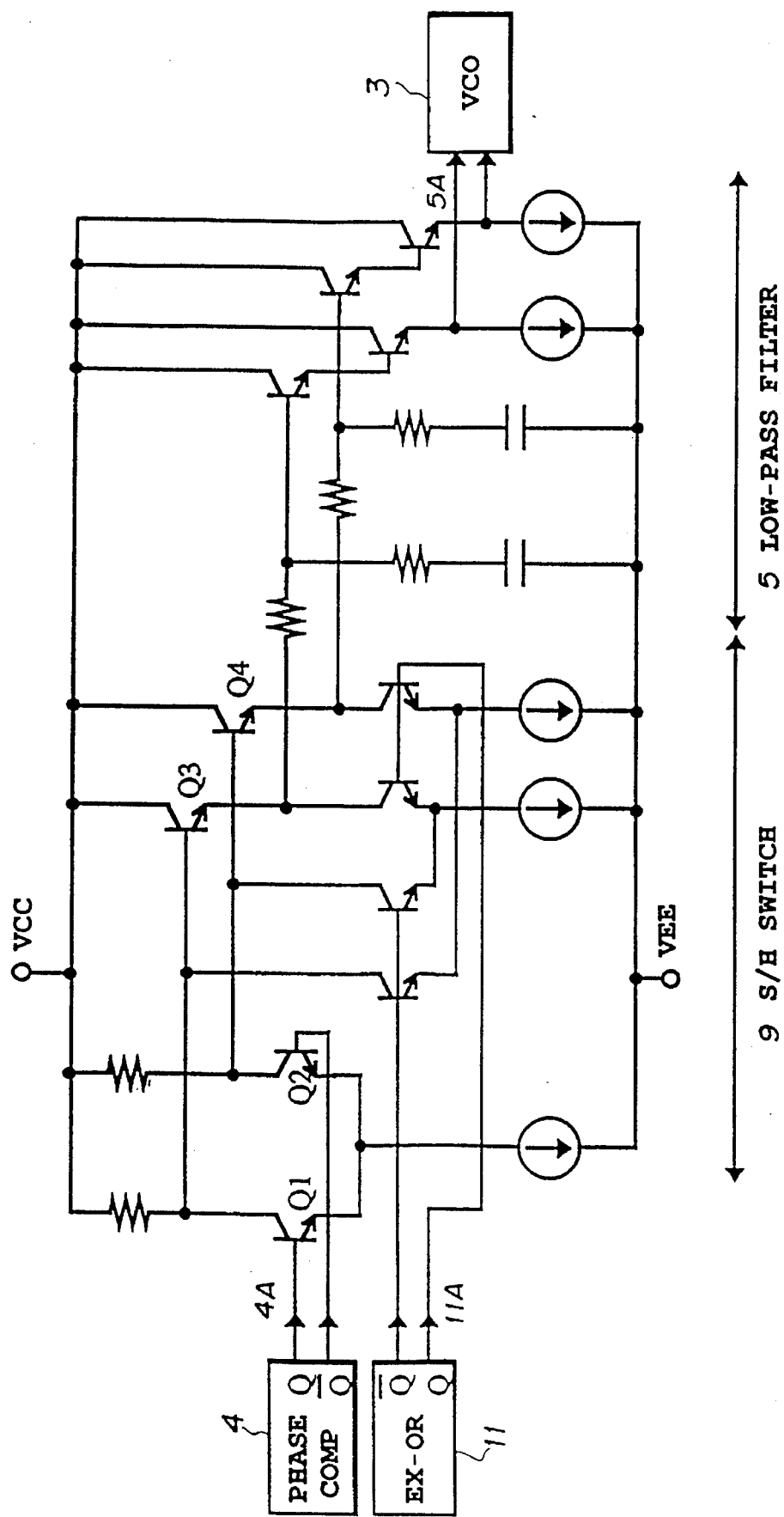
FIG. 20 is a circuit diagram showing a sample and hold switch circuit and a low-pass filter of the eighth embodiment.
Figure 21:
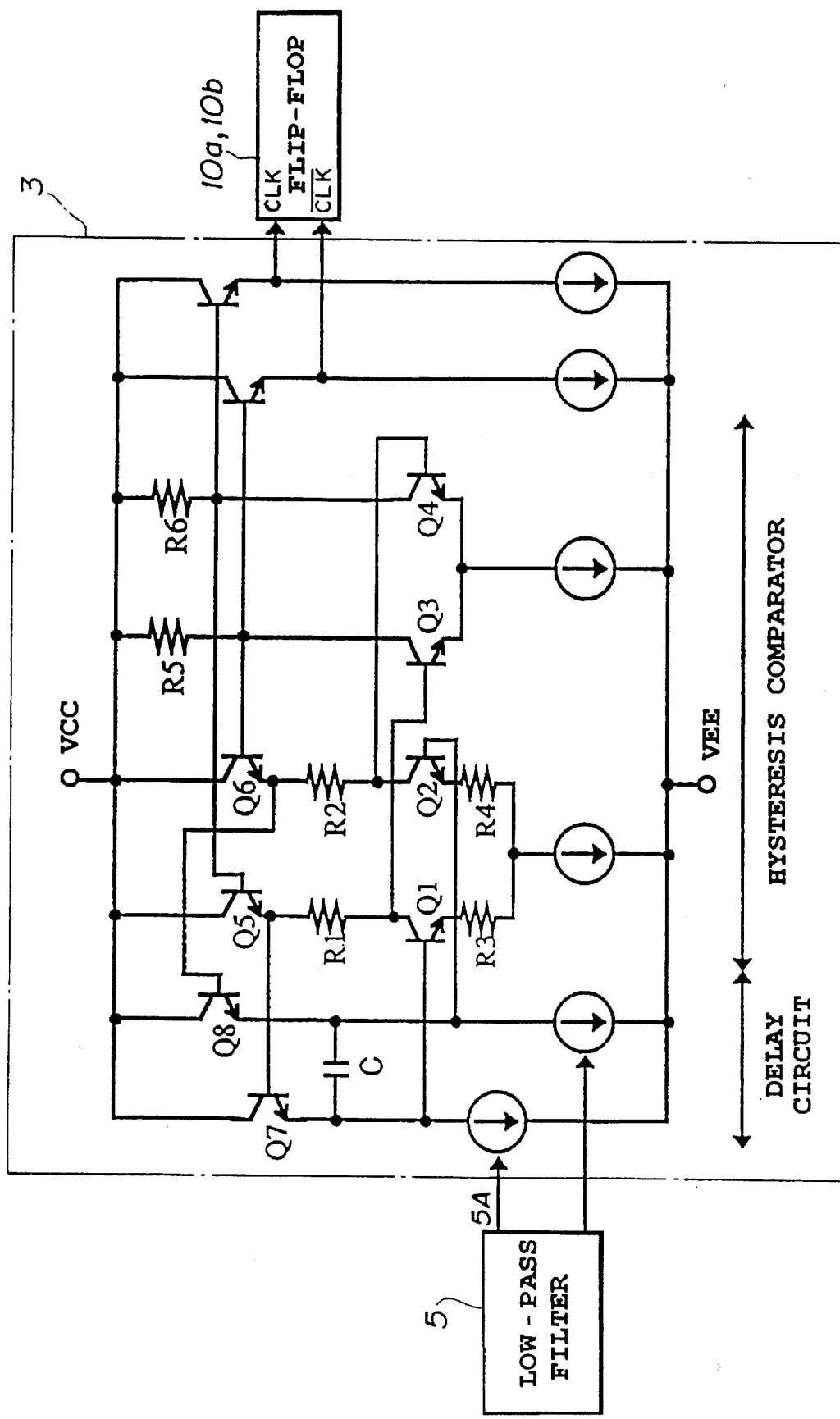
FIG. 21 is a circuit diagram showing a VCO of the eighth embodiment.

FIGS. 19–21 are circuit diagrams showing an eighth embodiment of the phase lock loop circuit in accordance with the present invention, which is applied to a data and clock recovery circuit. This embodiment is proposed as a monolithic integration of the fourth embodiment as shown in FIG. 13. The circuits of these figures have a differential configuration in order to improve the common mode noise rejection ratio, and hence the elements are interconnected with two lines. The 90 degree delay circuit shown in FIG. 19 is included in the phase comparator 4 (as its part) in the block diagram of FIG. 3.

FIG. 19 shows the phase comparator 4. A conventional multiplier type phase comparator has the problem that the average DC level of the output changes depending on the data mark ratio even when the phase difference between two inputs is constant. To solve this problem, two multiplier circuits are combined in this embodiment. The first multiplier circuit, consisting of transistors Q1–Q6, and resistors R1 and R2, compares the phase of the input data 6A and that of the output of the master flip-flop 10a. The second multiplier circuit, consisting of Q1 and Q2, Q5–Q8, and resistors R1 and R2, compares the phase of the input data and that of the 90-degree delayed input data. The average DC output level of the second multiplier depends only on the mark ratio because the second multiplier compares the two signals whose phase difference is 90 degrees. Therefore, subtracting the output of the second multiplier from that of the first multiplier cancels the effect of the mark ratio. As a result, a phase difference output between the master flip-flop output and the 90-degree delayed input data, which is independent of the mark ratio, can be obtained. The VCO frequency can be stably controlled by using the phase difference output.

FIG. 20 shows the differential type sample and hold switch circuit 9 and low-pass filter 5. Using the differential type makes it possible to prevent the VCO from being affected by the common mode noise. When the output 11A of the exclusive OR circuit 11 is high, the sample and hold switch circuit 9 is in the on state (sampling mode), and the output of the phase comparator is supplied to the low-pass filter 5. Conversely, when the output 11A is low, the transistors Q3 and Q4 are turned off, and the sample and hold switch circuit 9 enters into the off state (holding mode). Thus, the output of the phase comparator 4 is blocked so that the output of the low-pass filter 5 is maintained.

FIG. 21 shows the VCO 3. A conventional VCO uses diode loads, and the limiting operation of the diode loads is thought to produce a large jitter. To solve this problem, a circuit configuration without employing a diode limiter is adopted.

A portion of the circuit of FIG. 21, consisting of transistors Q1–Q6 and resistors R1–R6, is a hysteresis comparator that uses the positive feedback technique. The output is inverted when the input signal swing exceeds a certain voltage. The differential input terminals are base terminals of the transistors Q1 and Q2, and the output terminals are collector terminals of the transistors Q3 and Q4. A portion of the circuit, consisting of the transistors Q7 and Q8 and a capacitor C, is a delay circuit. The delay of the delay circuit is provided by a charging current Ic flowing into the capacitor C. The oscillation of the VCO is obtained by the positive feedback from the output to the input of the hysteresis comparator through the delay circuit. The oscillation frequency is determined by the delay time of the delay circuit and the hysteresis characteristics of the comparator, and hence the frequency can be varied by controlling the charging current Ic. The output of the VCO 3 is applied to the clock terminals of the flip-flops 10a and 10b.

A similar technique is applied to the 90-degree phase-delay circuit shown in FIG. 19. More specifically, the VCO becomes the 90-degree delay circuit by disconnecting base terminals of the transistors Q7 and Q8, and used these base terminals as the data input terminals. In this circuit, the rising and falling edges of the input data are inclined through the delay circuit, and the hysteresis comparator renews the delayed data waveform. The values of the capacitor C, the charging current Ic and the hysteresis voltage are selected such that the input data is delayed by 90 degrees.

The phase lock loop circuit of this embodiment is fabricated using Si-bipolar super-self-aligned process technology, disclosed in Konaka, S. et al., "A 30 ps Si bipolar IC using self-aligned process Technology" in conf. Solid State Devices and Materials, Extended Abstr, pp. 209–212, 1984. The cut-off frequency of the transistors is 16 GHz. The sizes of the IC chip is 3 mm×2.8 mm. It contains two 30 pF capacitors for the low-pass filter. Error free operation is obtained for the input data whose data rate is 156 Mb/s, and which includes 23 bits of consecutive 1s and 0s. Both capture and lock ranges of more than 10 MHz are also obtained, which are more than twenty times those of the conventional reference product of FIG. 22C. No external parts are required except for the by-pass capacitor for the power supply.

Figure 22A:
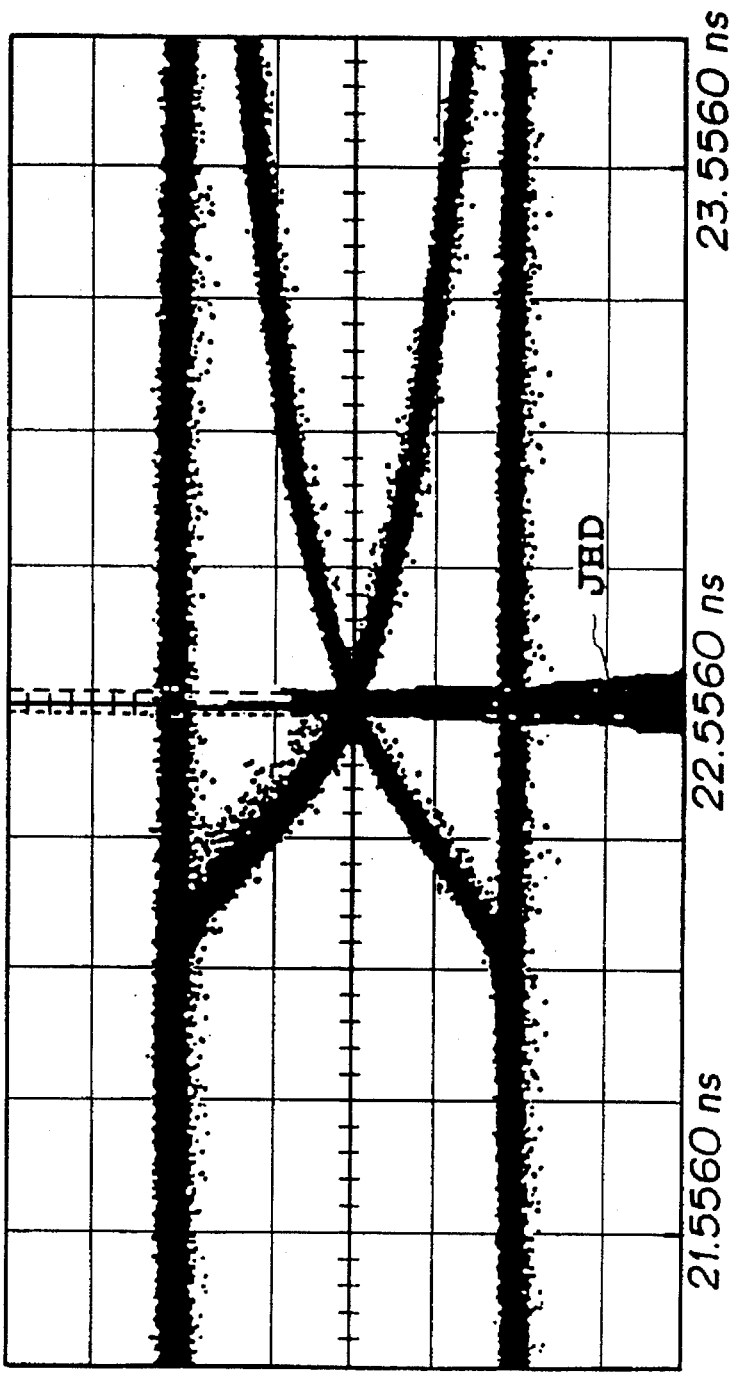
FIG. 22A is a graph illustrating a jitter histogram of the output data of the eighth embodiment.
Figure 22B:
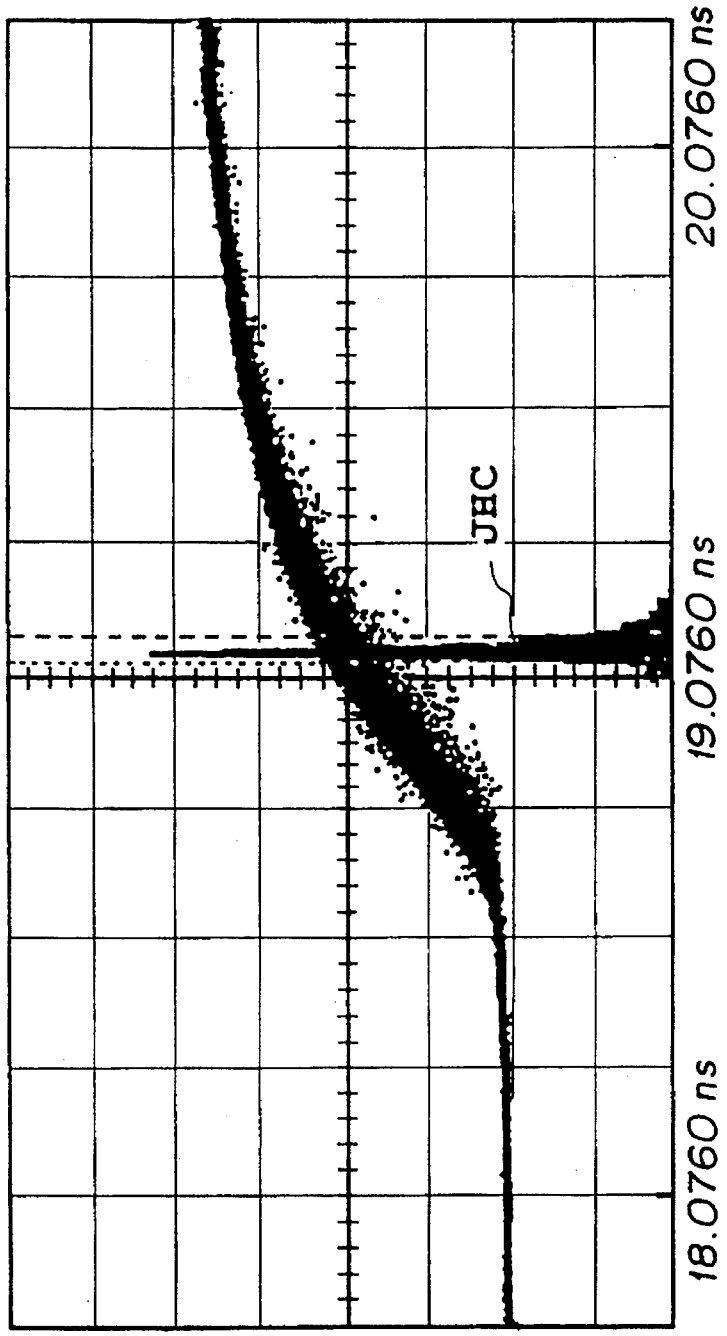
FIG. 22B is a graph illustrating a jitter histogram of the recovered clock of the eighth embodiment.

FIGS. 22A and 22B illustrate jitter histograms measured with a sampling oscilloscope. The jitter histogram of the retimed data is denoted by JHD, and that of the recovered clock is denoted by JHC. Both the retimed data and recovered clock have all rms jitter of 1.2 degrees, which is about one third of the values of the conventional reference product of FIG. 22C. The chip of this embodiment consumes 320 mW at −5.2 V and −2 V supply voltages, which is less than half of the power consumption of the conventional reference product.

The monolithic integration of the other embodiments 1–3, 5–7 is also possible by using a technique similar to that described above.

VARIATIONS OF THE CONTROL CIRCUIT

Next, variations of the S/H control circuit 8 used in the embodiments 1–8 are explained.

VARIATION 1

Figure 23:
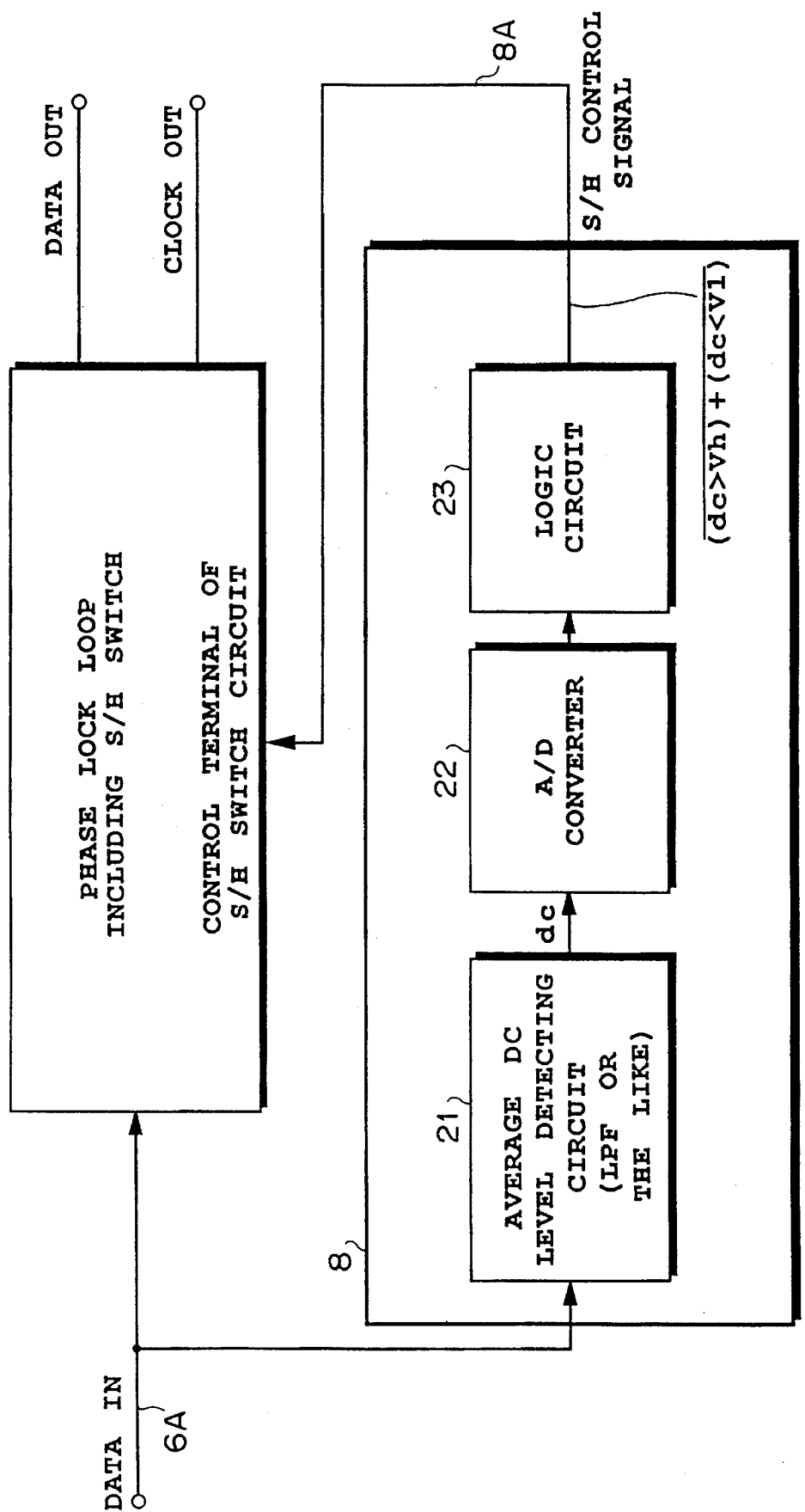
FIG. 23 is a block diagram showing a first variation of a control circuit of the embodiments.

FIG. 23 shows a first variation of the S/H control circuit. The control circuit is composed of an average DC level detecting circuit 21, an A/D converter 22, and a logic circuit 23.

Figure 24:
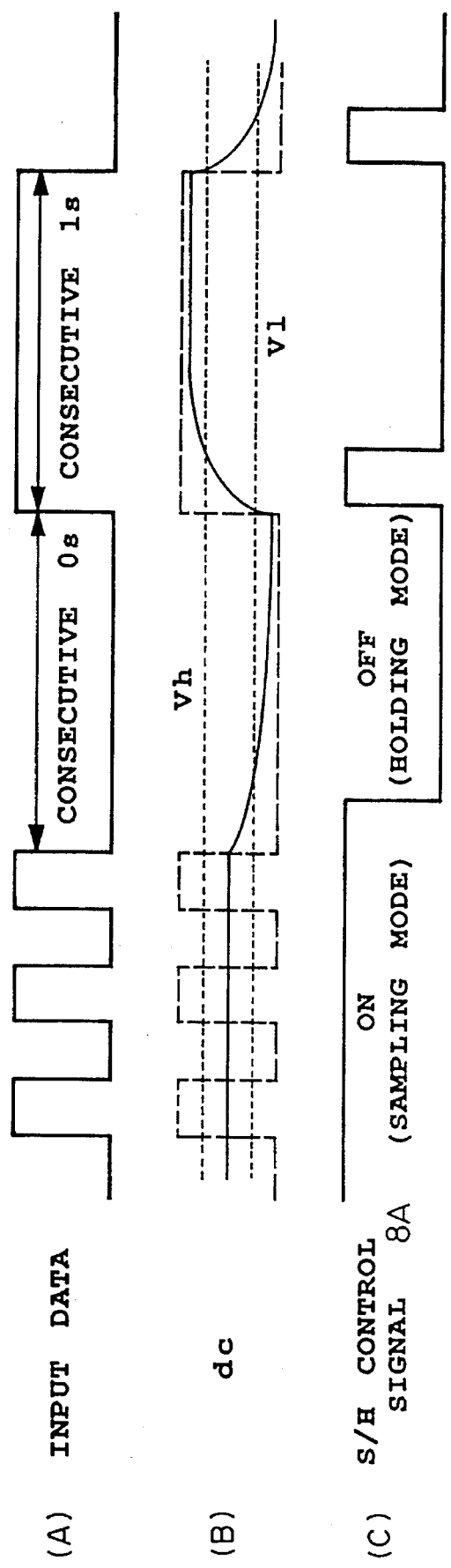
FIG. 24 is a diagram illustrating waveforms of the first variation.

The average DC level detecting circuit 21 is an integrating circuit having a low-pass filtering function, and outputs the average DC voltage dc of the alternating input signal. In other words, it outputs the middle voltage of the waveform of the alternating input signal as the average DC voltage dc when the input data is an alternation of 0s and 1s (see, (A) and (B) of FIG. 24). On the other hand, when the consecutive 0s or 1s occur, the average DC voltage dc approaches the voltage associated with 0 or 1. In other words, the consecutive identical bit state can be detected by the DC voltage dc. The A/D converter 22 digitizes the DC voltage dc. When the DC voltage dc exceeds a predetermined high voltage Vh or drops below a predetermined low voltage V1, the logic circuit 23 judges that the consecutive identical bit state has occurred, and outputs the low level S/H control signal 8A (see, (C) of FIG. 24). Thus, the sample and hold switch circuit is turned off, thereby maintaining the holding mode.

VARIATION 2

Figure 25:
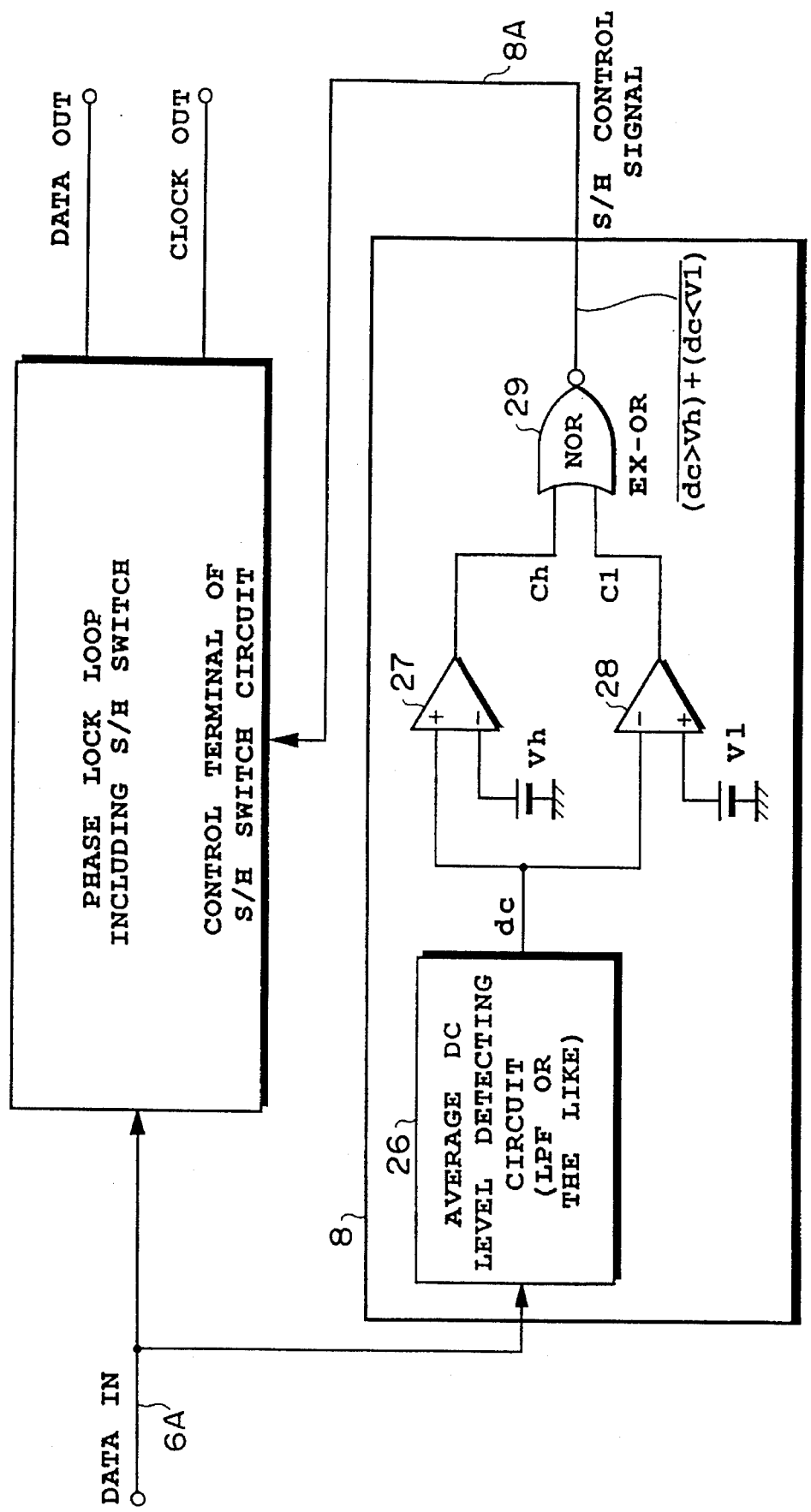
FIG. 25 is a block diagram showing a second variation of the control circuit of the embodiments.

FIG. 25 shows a second variation of the S/H control circuit. The control circuit is composed of an average DC level detecting circuit 26, two comparators 27 and 28, and a NOR circuit (or an exclusive OR circuit) 29.

Figure 26:
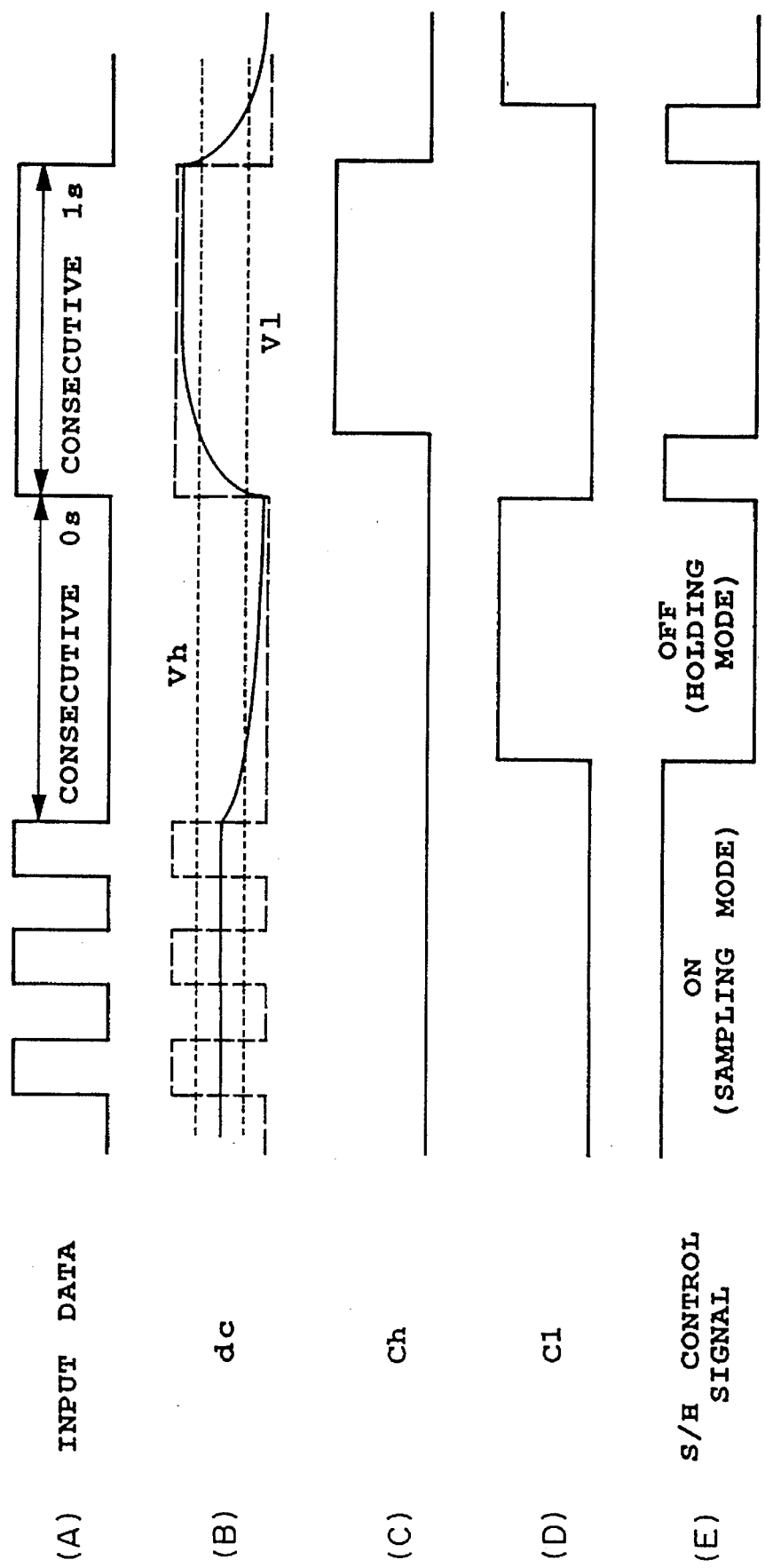
FIG. 26 is a diagram illustrating waveforms of the second variation.

The output Ch of the comparator 27 becomes the high level when the DC voltage dc exceeds the predetermined high voltage Vh as shown in (C) of FIG. 26, and the output C1 of the comparator 28 becomes the high level when the DC voltage dc drops below the predetermined low voltage V1 as shown in (D) of FIG. 26. In response to this, the NOR circuit 29 outputs the low level S/H control signal 8A when the consecutive identical bit state occurs as shown in (E) of FIG. 26.

VARIATION 3

Figure 27:
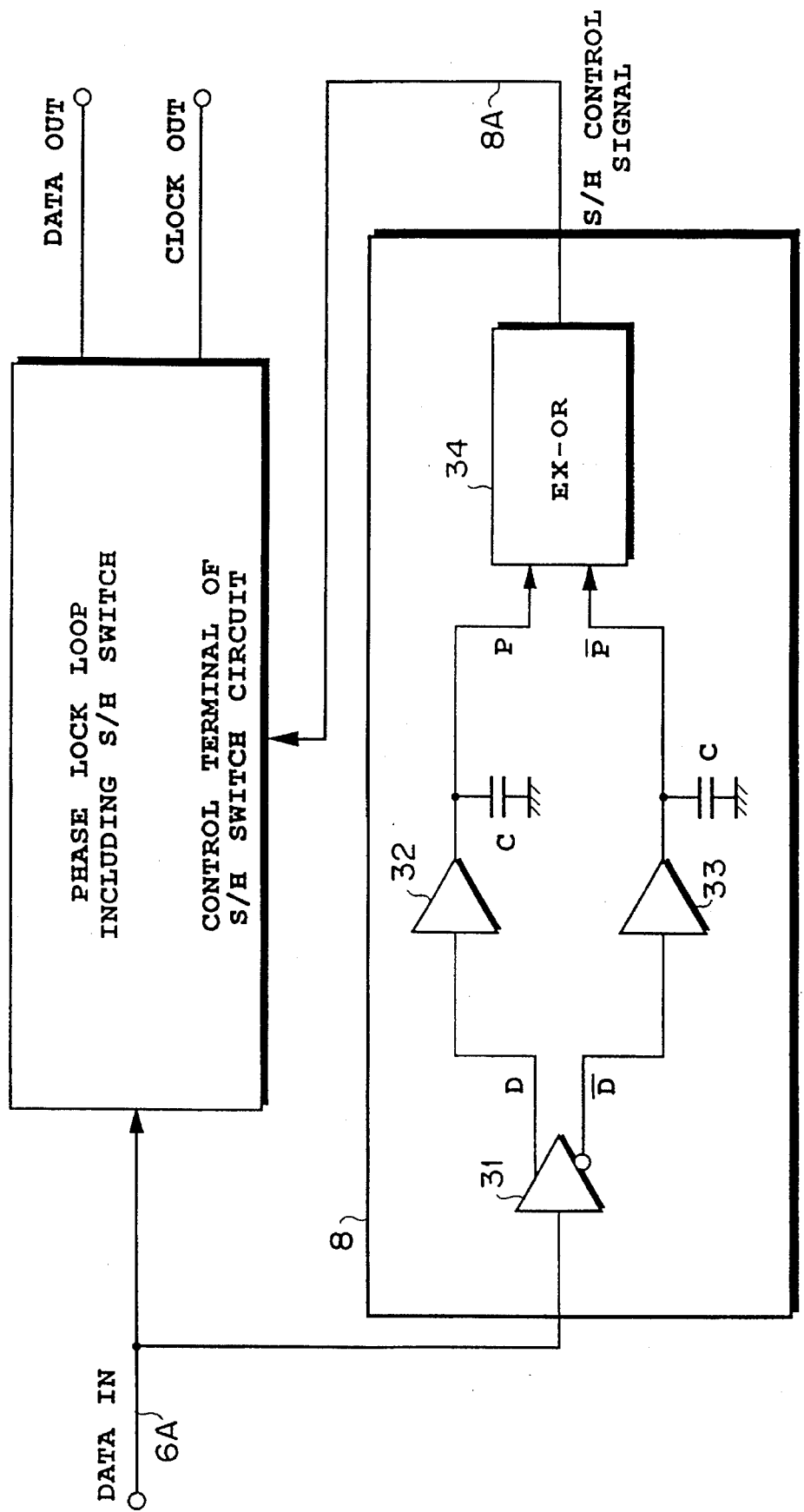
FIG. 27 is a block diagram showing a third variation of the control circuit of the embodiments.

FIG. 27 shows a third variation of the S/H control circuit. The control circuit 8 is composed of a complementary output circuit 31, two peak detecting circuits 32 and 33, and an exclusive OR circuit 34.

Figure 28:
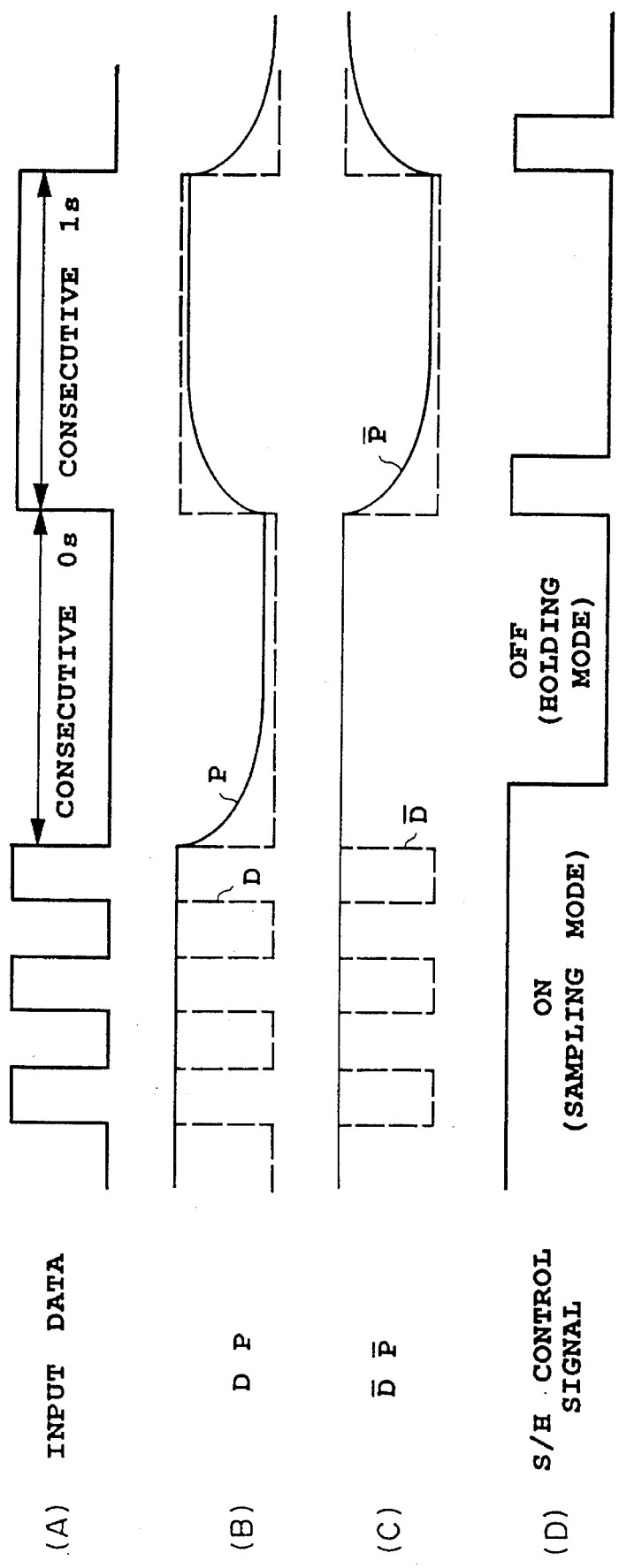
FIG. 28 is a diagram illustrating waveforms of the third variation.

The complementary output circuit 31 produces both non-inverted and inverted signals of the input data. The peak detecting circuits 32 and 33 try to hold the peak values of these signals as shown in (A)–(C) (C) of FIG. 28. Although the peak values ideally continue infinitely, they gradually decrease in the actual circuits owing to a leakage current. Accordingly, the peak values, which are maintained during the alternating state of 0s and 1s, vary as shown in (B) and (C) of FIG. 28 if identical bits continue. In response to this, the exclusive OR circuit 34 outputs the low level S/H control signal 8A when the consecutive identical bit state occurs, as shown in (D) of FIG. 28.

VARIATION 4

Figure 29:
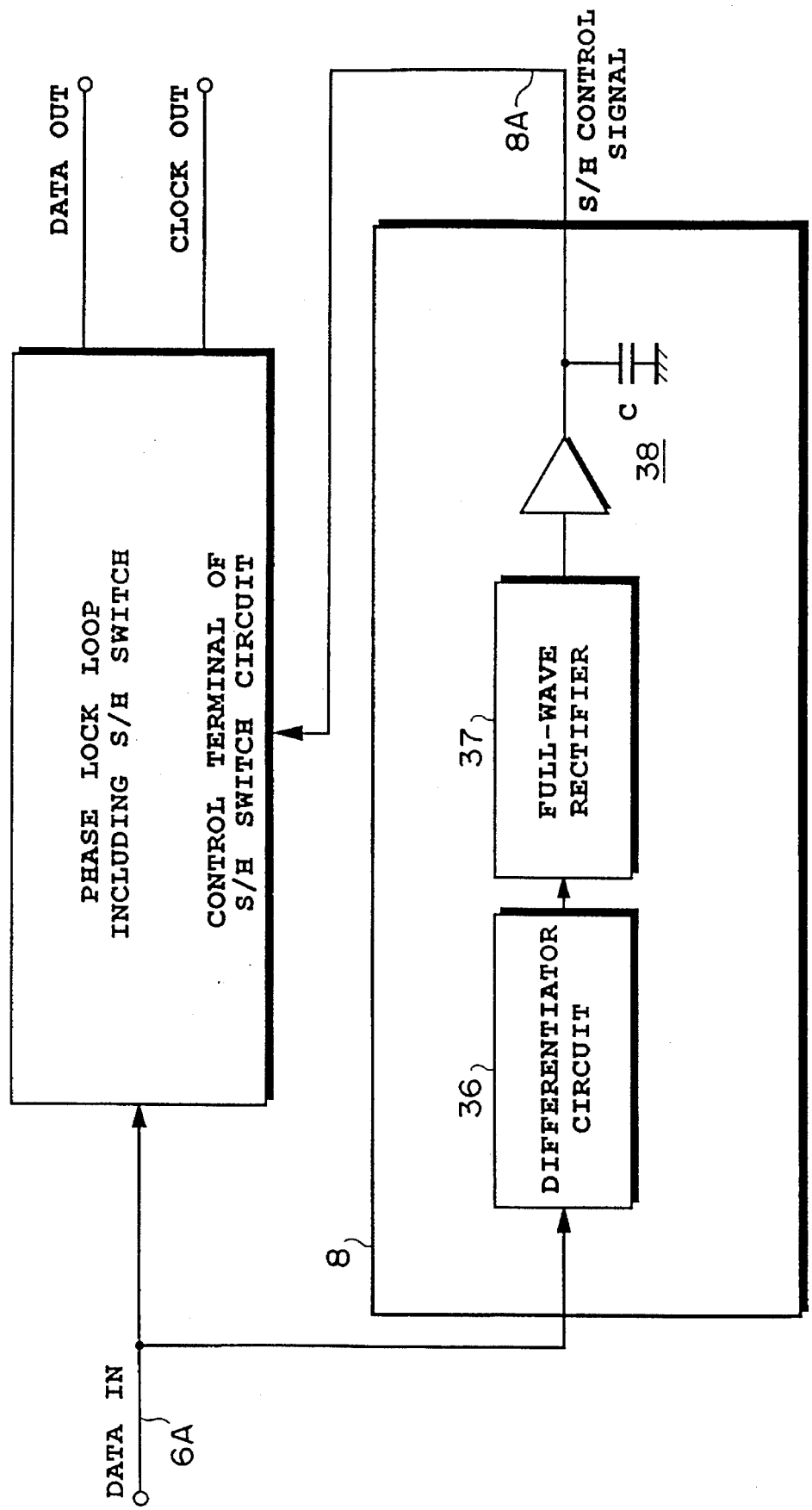
FIG. 29 is a block diagram showing a fourth variation of the control circuit of the embodiments.

FIG. 29 shows a fourth variation of the S/H control circuit. The control circuit 8 is composed of a differentiator circuit 36, a full-wave rectifier 37, and a peak value holding circuit 38.

Figure 30:
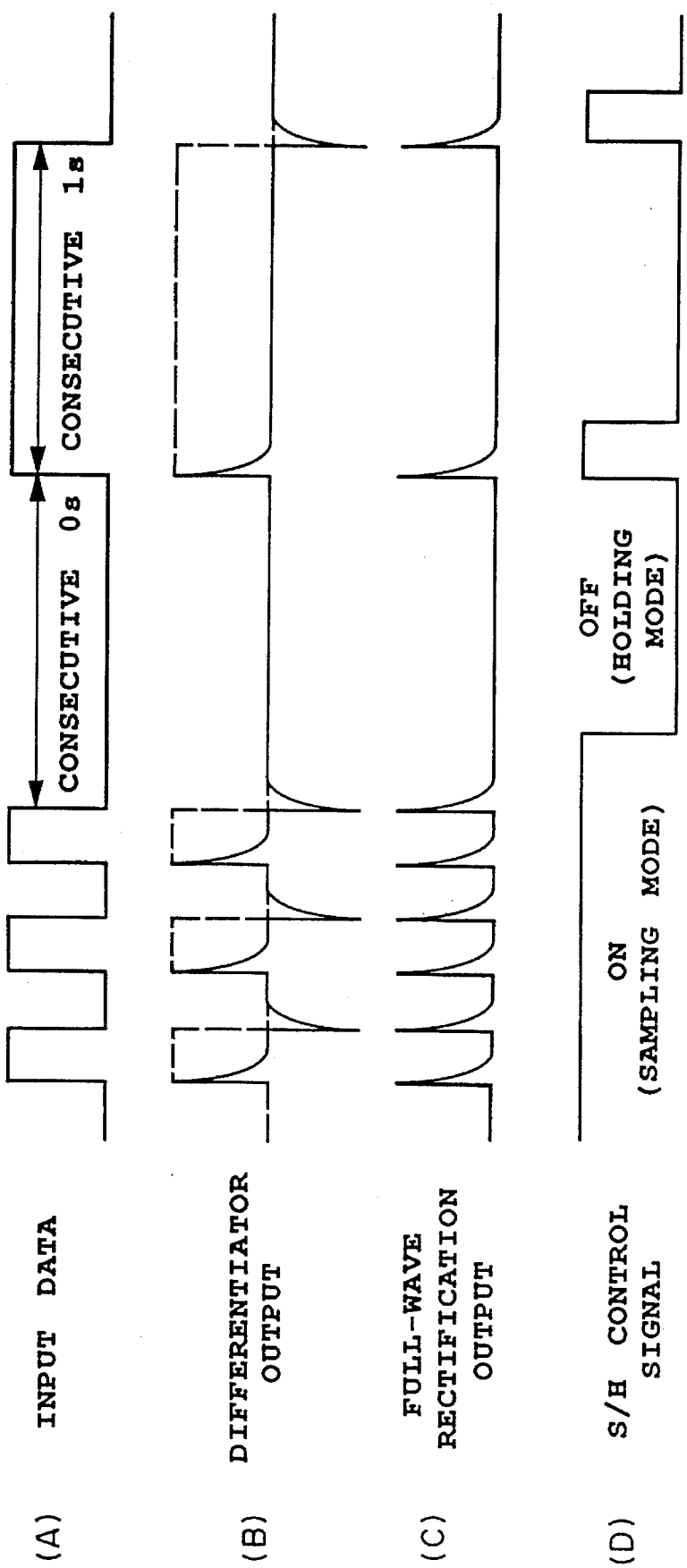
FIG. 30 is a diagram illustrating waveforms of the fourth variation.

In this variation, rising and falling edges of the input data, which are detected by the differentiator circuit 36, are subjected to full-wave rectification by the full-wave rectifier 37, and peak values of the output of the full-wave rectifier are held by the peak value holding circuit 38 as shown in (A)–(D) of FIG. 30. The holding time is set at about a 1-bit interval, that is, a time period required to transmit the phase compared signal from the phase comparator to the low-pass filter. According to this embodiment, the differentiated output is not obtained during the consecutive identical bit state, and hence the S/H control signal 8A becomes a low level, and the sample and hold switch circuit is put in all off state (holding mode) as shown in (D) of FIG. 30.

APPLICATION TO FUNCTIONAL CIRCUITS OTHER THAN THE DECISION CIRCUIT

Although the phase lock loop circuit in accordance with the present invention is combined with the decision circuit (that is, a digital signal receiving circuit) 1 in the above-described embodiments 1–8, it can be applied to other functional circuits.

Figure 31:
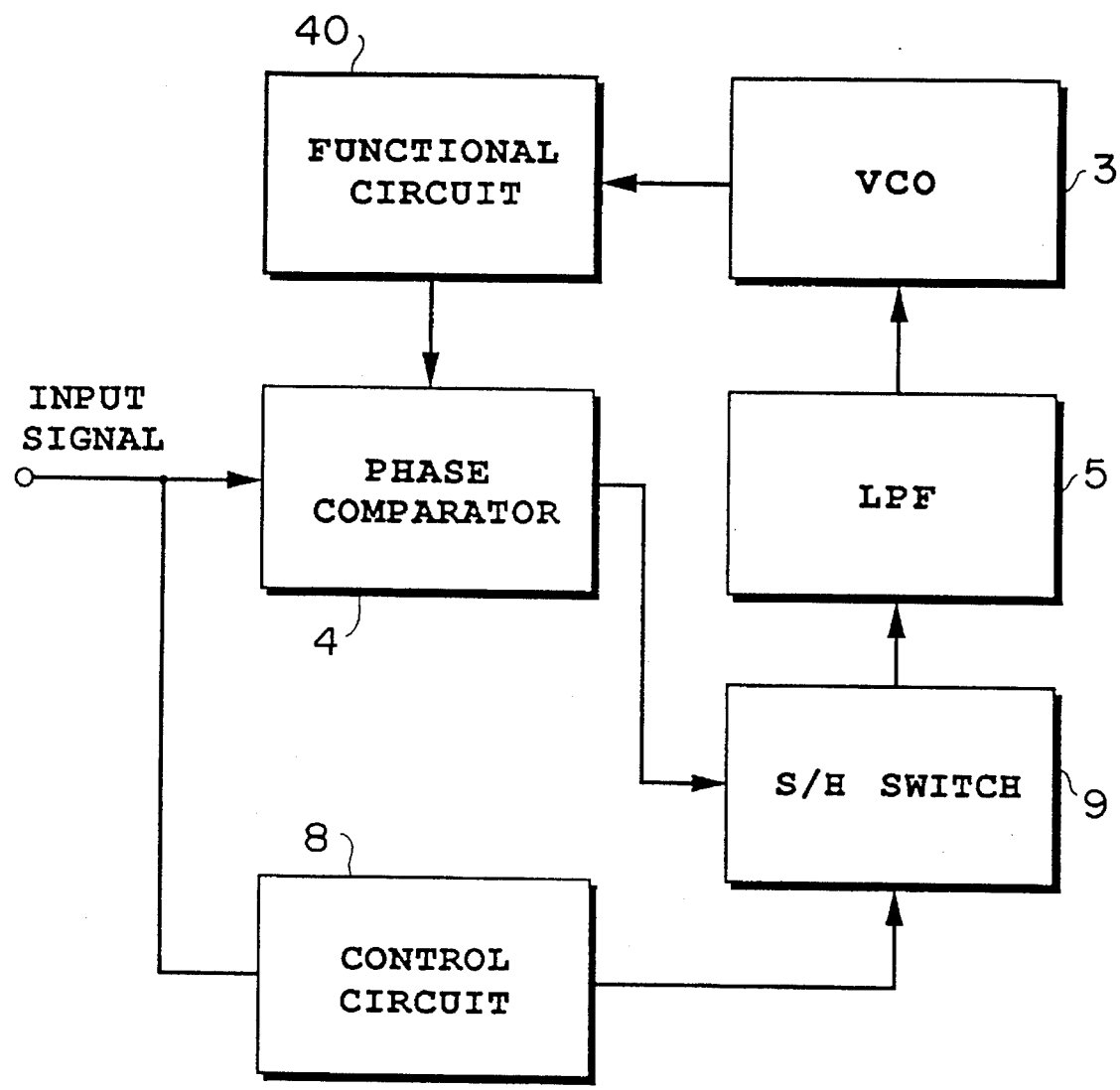
FIG. 31 is a block diagram showing the relationship between a functional circuit and the phase lock loop circuit in accordance with the present invention.

FIG. 31 is a block diagram showing such a functional circuit combined with the phase lock loop circuit in accordance with the present invention. Examples of the functional circuit 40 are as follows:

(1) Functional circuits having a frequency converting function.

Applying the phase lock loop circuit to a circuit having a frequency converting function makes it possible to set the ratio between the frequency of the input signal and that of the output signal at a desired value.

(a) 1/n frequency divider a fixed frequency divider using flip-flops; a variable frequency divider (a programmable frequency divider); a variable frequency divider using a pulse swallowing counter; and a mixer.

(b) n frequency multiplier a multiplier using an exclusive OR circuit; and a mixer.

(2) Functional circuits having a delay function

The relationship between phases of the input and output signals can be determined at a desired value by combining the phase lock loop circuit with a functional circuit having a delay function. This type of circuit is mainly applied to an analog demodulator.

(a) a fixed delay circuit an RC delay circuit; and a logical delay circuit using flip-flops.

(b) a variable delay circuit a variable delay circuit using charge and discharge characteristics of a capacitance; and a logical variable delay circuit using phase selection.

Next, application of the phase lock loop circuit in accordance with the present invention will be described in more detail.

(1) Application to digital signal detecting circuits

As stated before, the phase lock loop circuit in accordance with the present invention is employed to recover a timing signal from input data.

Figure 32:
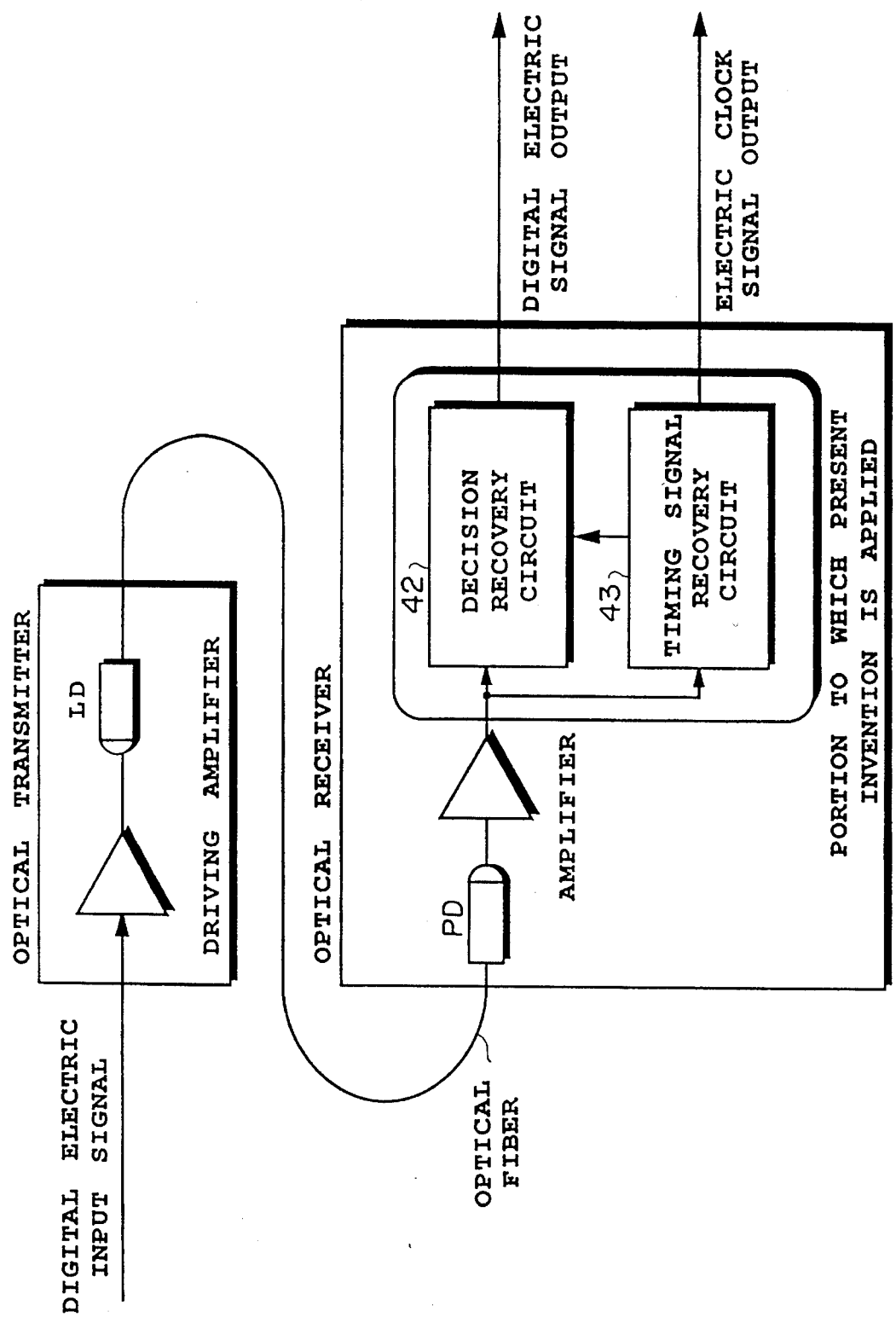
FIG. 32 is a block diagram showing an optical receiver employing the phase lock loop circuit in accordance with the present invention.

FIG. 32 shows an optical receiver employing the phase lock loop circuit in accordance with the present invention. An optical signal received is amplified by an amplifier, and is supplied to a decision recovery circuit 42. The decision recovery circuit 42 recovers a digital signal from the input data using a clock signal sent from a timing signal recovery circuit 43. The decision recovery circuit 42 corresponds to the functional circuit 40 of FIG. 31.

A similar circuit is applicable to recover data from a storage medium such as an optical disk, a magnetic disk, a magnetic tape, or the like.

(2) Application to analog demodulators

The phase lock loop circuit in accordance with the present invention can be applied to an AM demodulator and an FM demodulator.

Figure 33:
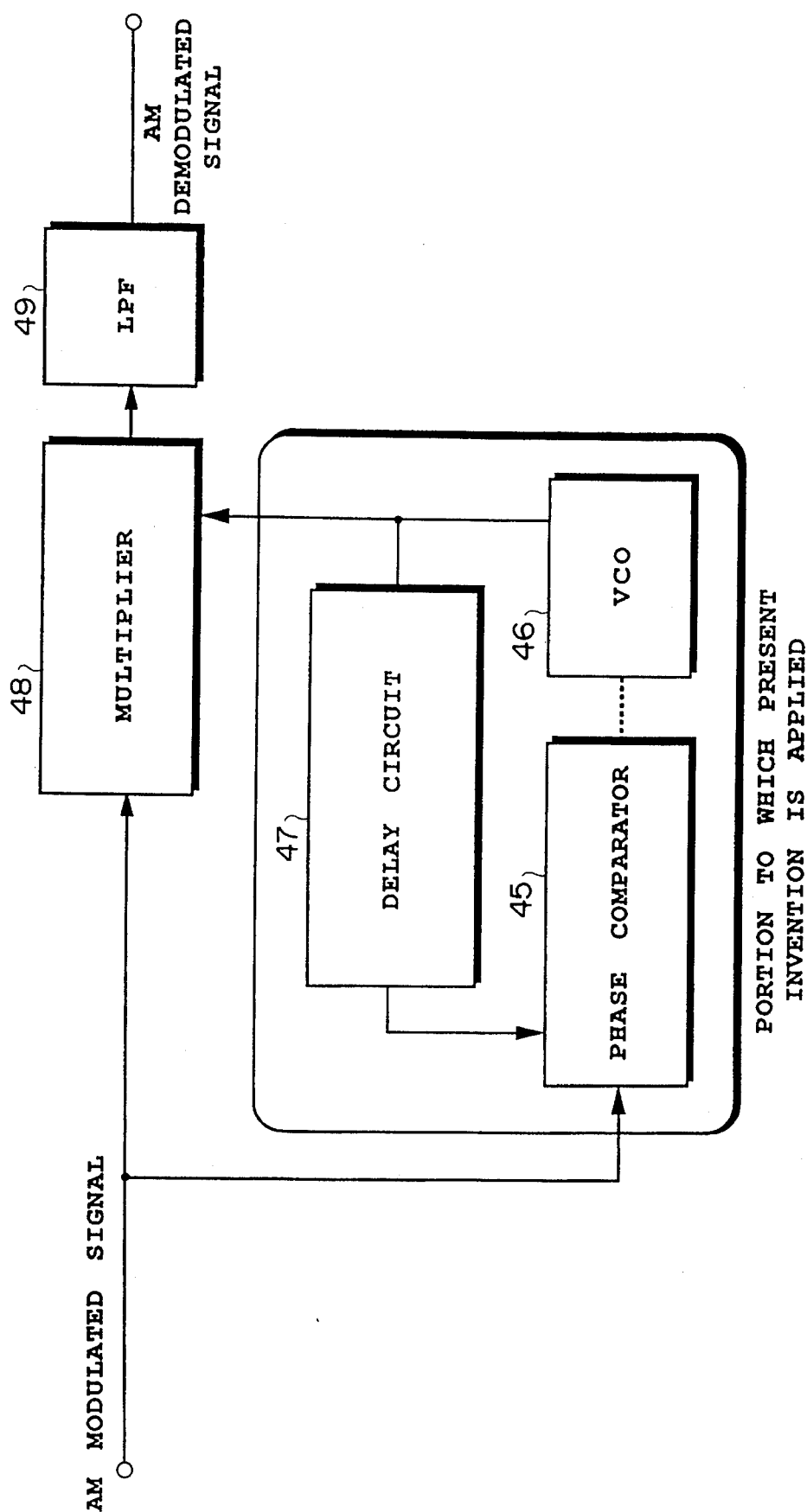
FIG. 33 is a block diagram showing an AM demodulator employing the phase lock loop circuit in accordance with the present invention.

FIG. 33 shows an application to an AM demodulator. First, a carrier component of an AM signal is detected using a phase lock loop circuit including a phase comparator 45, a VCO 46, a delay circuit 47, etc. Second, the carrier of a constant amplitude supplied from the VCO 46 is multiplied by the AM signal by a multiplier 48, and the analog component of the output of the multiplier is extracted through a low-pass filter 49. The phase lock loop circuit in accordance with the present invention makes stable operation possible in spite of jitter of the carrier signal.

Figure 34:
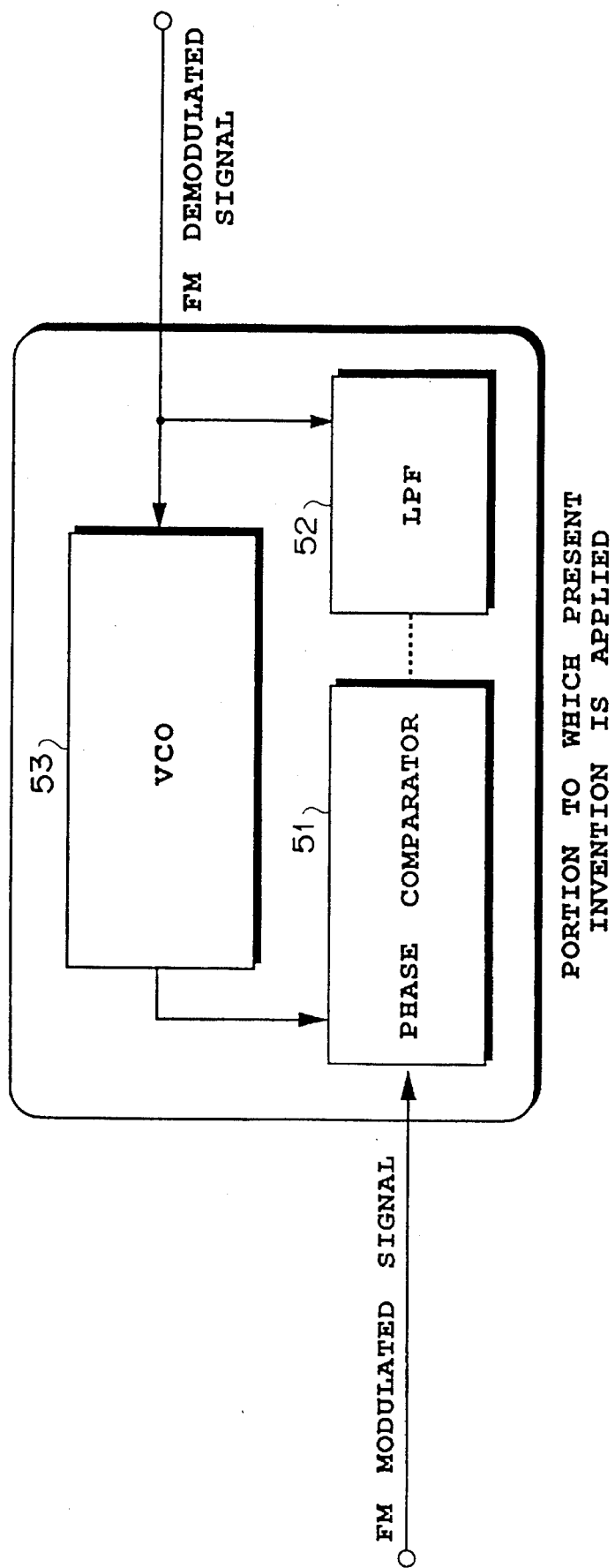
FIG. 34 is a block diagram showing an FM demodulator employing the phase lock loop circuit in accordance with the present invention.

FIG. 34 shows an application to an FM demodulator. The demodulator consists of a phase lock loop circuit including a phase comparator 51, a low-pass filter 52, VCO 53, and so forth, and an FM modulated signal is input to the phase lock loop circuit. As a result, a demodulated signal is output from the low-pass filter 52. The phase lock loop circuit in accordance with the present invention makes a very stable and precise demodulation possible even for an FM signal whose modulation factor is very large.

(3) Application to frequency synthesizers

Figure 35:
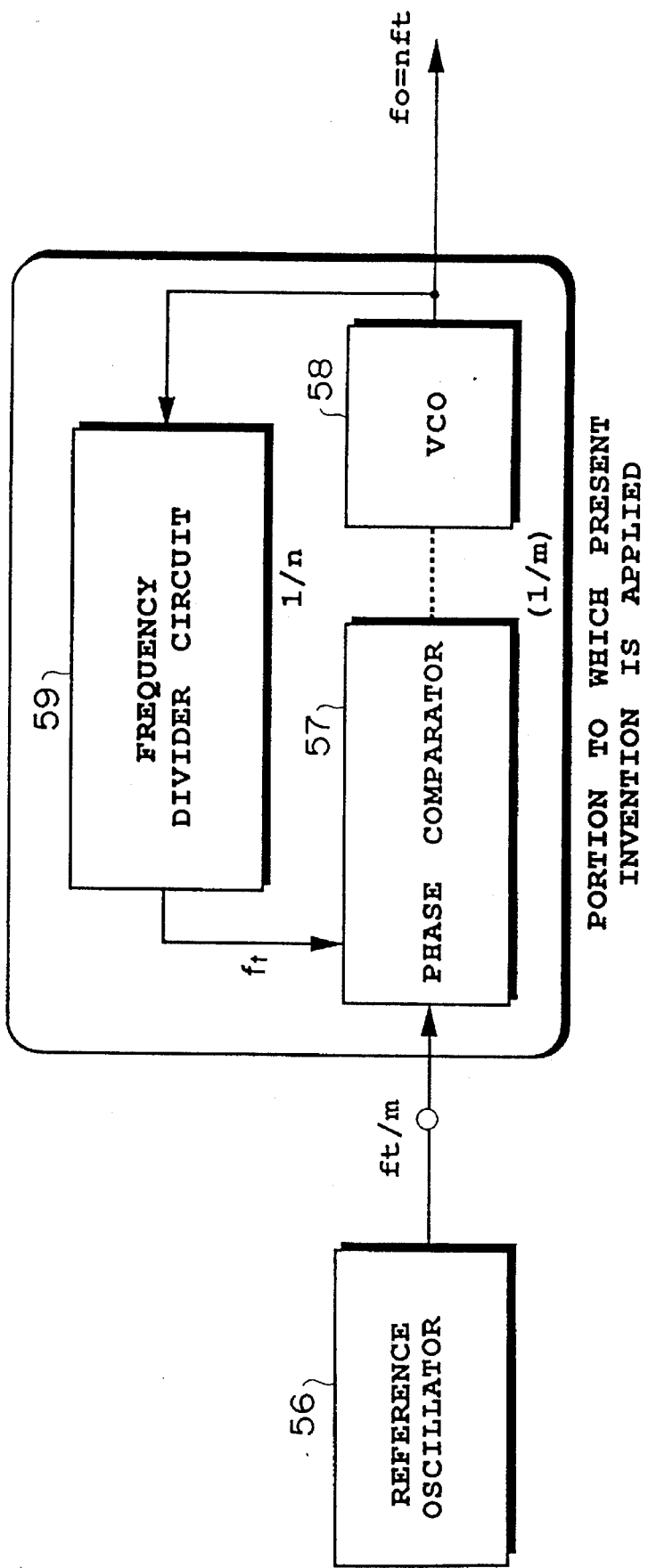
FIG. 35 is a block diagram showing a frequency synthesizer employing the phase lock loop circuit in accordance with the present invention.

FIG. 35 shows an application of the phase lock loop circuit in accordance with the present invention to a frequency synthesizer. The synthesizer is characterized in that two input signals of different frequencies are supplied to a phase comparator. More specifically, a signal whose frequency is $f_r/m$ is supplied from a reference oscillator 56 to a phase comparator 57 as a first input, and a signal whose frequency is $f_o/n$ $(=f_r)$ obtained by dividing the output frequency of a VCO 58 by a frequency divider 59 is supplied to the phase comparator as a second input, where $f_o$ is the frequency of the output signal, and m and n are positive integers.

In a conventional frequency synthesizer, a signal whose frequency is identical to that of the output frequency ft of the frequency divider is supplied from the reference oscillator to the phase comparator. In this embodiment, however, the reference signal whose frequency is $f_r/m$ is supplied from the reference oscillator 56 to the phase comparator 57. This is because the reference signal whose frequency is $f_r/m$ is sufficient for the phase comparator to achieve the phase comparison, because the phase compared state is maintained by the sample and hold switch circuit in the phase lock loop circuit in accordance with the present invention. Thus, the phase lock loop circuit of this embodiment automatically performs a 1/m sampling operation when the reference signal whose frequency is 1/m of the output frequency of the frequency divider 59 is input to the phase comparator. Thus, the phase locked output whose frequency is the same as that when m =1 ($nf_r$) is obtained.

Accordingly, the phase lock loop circuit of this embodiment is very advantageous to simplify a circuit configuration and establish stable operation, because a low reference frequency and a low dividing ratio frequency divider 59 can be employed.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A phase lock loop circuit comprising:

a phase comparator for detecting a phase difference between input data and a comparing signal;

a control circuit for detecting a consecutive identical bit state of the input data, and for outputting a control signal;

a sample and hold switch circuit for sampling and holding the output of the phase comparator, and for maintaining a holding mode in response to the control signal supplied from the control circuit while the consecutive identical bit state is being detected;

a direct current (DC) component detecting means for detecting a direct current (DC) component of the output of the sample and hold switch circuit; and a variable frequency oscillator for generating a signal whose frequency is controlled in accordance with the output of the direct current (DC) component detecting means, and for supplying the output signal of the variable frequency oscillator to the phase comparator as the comparing signal.

2. The phase lock loop circuit as claimed in claim 1, wherein the control circuit comprises a delay circuit for delaying the input data, and an exclusive OR circuit for performing an exclusive OR operation between the input data and the output of the delay circuit.

3. The phase lock loop circuit as claimed in claim 1, wherein the direct current (DC) component detecting means comprises a low-pass filter.

4. The phase lock loop circuit as claimed in claim 1, wherein the variable frequency oscillator comprises a voltage controlled oscillator.

5. The phase lock loop circuit as claimed in claim 1, further comprising a frequency multiplier for multiplying the frequency of the input data,
wherein the phase comparator detects the phase difference between the comparing signal and the input data whose frequency has been multiplied by the frequency multiplier.

6. The phase lock loop circuit as claimed in claim 1, wherein the variable frequency oscillator comprises a fixed frequency oscillator and a variable phase circuit.

7. The phase lock loop circuit as claimed in claim 1, wherein the phase lock loop circuit is formed into a monolithic integrated circuit.

8. The phase lock loop circuit as claimed in claim 7, wherein the phase comparator comprises a first multiplier for producing a phase difference between the input data and the output of the variable frequency oscillator, a second multiplier for producing a phase difference between the input data whose phase is not delayed and the input data whose phase is delayed by 90 degrees, and a subtracter for subtracting the output of the second multiplier from the output of the first multiplier.

9. The phase lock loop circuit as claimed in claim 7, wherein the variable frequency oscillator comprises a hysteresis comparator, and a delay circuit for delaying the output of the hysteresis comparator in accordance with the direct current (DC) component fed from the direct current (DC) component detecting means, and for positively feeding the delayed output of the hysteresis comparator back to the input of the hysteresis comparator.

10. The phase lock loop circuit as claimed in claim 7, wherein the sample and hold switch circuit is of a differential type and the direct current (DC) component detecting means comprises a differential type low-pass filter.

11. The phase lock loop circuit as claimed in claim 1, wherein the control circuit comprises a detecting circuit for detecting a direct current (DC) level of the input data, and an output circuit for producing the control signal that holds the sample and hold switch circuit when the direct current (DC) level is higher than a predetermined first level, or lower than a predetermined second level which is lower than the first level.

12. The phase lock loop circuit as claimed in claim 11, wherein the detecting circuit is a low-pass filter, and the output circuit comprises an analog-to-digital (A/D) converter that digitizes the output of the low-pass filter and a logic circuit that produces the control signal by comparing the output of the analog-to-digital (A/D) converter with the predetermined first and second levels.

13. The phase lock loop circuit as claimed in claim 11, wherein the detecting circuit comprises a low-pass filter, and the output circuit comprises a first comparator for comparing the direct current (DC) level with the first level, a second comparator for comparing the direct current (DC) level with the second level, and a NOR circuit that performs a NOR operation between the outputs of the first and second comparators.

14. The phase lock loop circuit as claimed in claim 1, wherein the control circuit comprises a complementary output circuit that outputs a noninverted signal and an inverted signal of the input data, a first peak detecting circuit for detecting a peak value of the noninverted signal, a second peak detecting circuit for detecting a peak value of the inverted signal, and an exclusive OR circuit for performing an exclusive OR operation between the outputs of the first and second peak detecting circuits.

15. The phase lock loop circuit as claimed in claim 1, wherein the control circuit comprises a differentiator circuit for producing a differentiated signal of the input data, a full-wave rectifier for performing a full-wave rectification on the output of the differentiator circuit, and a peak value holding circuit for holding a peak value of the output of the full-wave rectifier for a predetermined time period.

16. A phase lock loop circuit comprising:
a phase comparator for detecting a phase difference between input data and a comparing signal;
a control circuit for detecting a consecutive identical bit state of the input data, and for outputting a control signal;
a sample and hold switch circuit for sampling and holding the output of the phase comparator, and for maintaining a holding mode in response to the control signal supplied from the control circuit while the consecutive identical bit state is being detected;
a direct current (DC) component detecting means for detecting a direct current (DC) component of the output of the sample and hold switch circuit;
a variable frequency oscillator for generating a clock signal whose frequency is controlled in accordance with the output of the direct current (DC0 component detecting means; and
a functional circuit for providing the output of the variable frequency oscillator with a frequency conversion or a delay to obtain the comparing signal, and for supplying the comparing signal to the phase comparator.

17. The phase lock loop circuit as claimed in claim 16, wherein the functional circuit comprises a first flip-flop and a second flip-flop which are connected in cascade and operate in response to a clock signal fed from the variable frequency oscillator, and the first flip-flop delays the phase of the input data by substantially ½ bit to produce the comparing signal.

18. The phase lock loop circuit as claimed in claim 17, wherein the control circuit comprises an exclusive OR circuit for performing an exclusive OR operation between the input data and the output of the second flip-flop.

19. The phase lock loop circuit as claimed in claim 16, wherein the functional circuit comprises a flip-flop and a delay circuit which are connected in cascade, and the flip-flop delays the phase of the input data by substantially ½ bit in response to a clock signal fed from the variable frequency oscillator to produce the comparing signal, and supplies the comparing signal to the phase comparator.

20. The phase lock loop circuit as claimed in claim 19, wherein the control circuit comprises an exclusive OR circuit for performing an exclusive OR operation between the input data and the output of the delay circuit.

21. The phase lock loop circuit as claimed in claim 16, wherein the control circuit comprises a delay circuit for delaying the input data, and an exclusive OR circuit for performing an exclusive OR operation between the input data and the output of the delay circuit.

22. The phase lock loop circuit as claimed in claim 16, wherein the variable frequency oscillator is a voltage controlled oscillator.

23. The phase lock loop circuit as claimed in claim 16, wherein the variable frequency oscillator comprises a fixed frequency oscillator and a variable phase circuit.

24. The phase lock loop circuit as claimed in claim 16, wherein the direct current (DC) component detecting means comprises a low-pass filter.

25. The phase lock loop circuit as claimed in claim 18, wherein the phase lock loop circuit is formed into a monolithic integrated circuit.

26. The phase lock loop circuit as claimed in claim 25, wherein the phase comparator comprises a first multiplier for producing a phase difference between the input data and the output of the first flip-flop, a second multiplier for producing a phase difference between the input data whose phase is not delayed and the input data whose phase is delayed by 90 degrees, and a subtracter for subtracting the output of the second multiplier from the output of the first multiplier.

27. The phase lock loop circuit as claimed in claim 25, wherein the variable frequency oscillator comprises a hysteresis comparator, and a delay circuit for delaying the output of the hysteresis comparator in accordance with the direct current (DC) component fed from the direct current (DC) component detecting means, and for positively feeding the delayed output of the hysteresis comparator back to the input of the hysteresis comparator.

28. The phase lock loop circuit as claimed in claim 25, wherein the sample and hold switch circuit is of a differential type and the direct current (DC) component detecting means is a differential type low-pass filter.

29. The phase lock loop circuit as claimed in claim 16, wherein the control circuit comprises a detecting circuit for detecting a direct current (DC) level of the input data, and an output circuit for producing the control signal that holds the sample and hold switch circuit when the direct current (DC) level is higher than a predetermined first level, or lower than a predetermined second level which is lower than the first level.

30. The phase lock loop circuit as claimed in claim 29, wherein the detecting circuit comprises a low-pass filter, and the output circuit comprises an analog-to-digital (A/D) converter that digitizes the output of the low-pass filter and a logic circuit that produces the control signal by comparing the output of the analog-to-digital (A/D) converter with the predetermined first and second levels.

31. The phase lock loop circuit as claimed in claim 29, wherein the detecting circuit comprises a low-pass filter, and the output circuit comprises a first comparator for comparing the direct current (DC) level with the first level, a second comparator for comparing the direct current (DC) level with the second level, and a NOR circuit that performs a NOR operation between the outputs of the first and second comparators.

32. The phase lock loop circuit as claimed in claim 16, wherein the control circuit comprises a complementary output circuit that outputs a noninverted signal and an inverted signal of the input data, a first peak detecting circuit for detecting a peak value of the noninverted signal, a second peak detecting circuit for detecting a peak value of the inverted signal, and an exclusive OR circuit for performing an exclusive OR operation between the outputs of the first and second peak detecting circuits.

33. The phase lock loop circuit as claimed in claim 16, wherein the control circuit comprises a differentiator circuit for producing a differentiated signal of the input data, a full-wave rectifier for performing a full-wave rectification on the output of the differentiator circuit, and a peak value holding circuit for holding a peak value of the output of the full-wave rectifier for a predetermined time period.

34. A signal processing circuit comprising:

a phase comparator for detecting a phase difference between input data and a comparing signal;

a control circuit for detecting a consecutive identical bit state of the input data, and for outputting a control signal;

a sample and hold switch circuit for sampling and holding the output of the phase comparator, and for maintaining in response to the control signal supplied from the control circuit a holding mode while the consecutive identical bit state is being detected;

a direct current (DC) component detecting means for detecting a direct current (DC) component of the output of the sample and hold switch circuit;

a variable frequency oscillator for generating a signal whose frequency is controlled in accordance with the output of the direct current (DC) component detecting means; and a functional circuit for processing the input data, for providing the output of the variable frequency oscillator with a frequency conversion or a delay to obtain the comparing signal, and for supplying the comparing signal to the phase comparator.

35. The signal processing circuit as claimed in claim 34, wherein the functional circuit comprises a circuit that recovers the input data.

36. The signal processing circuit as claimed in claim 34, wherein the input data is an amplitude modulation (AM) signal, and the functional circuit comprises a multiplier for multiplying the amplitude modulation (AM) signal by the output of the variable frequency oscillator, and a delay circuit for delaying the output of the variable frequency oscillator and for feeding the delayed output of the variable frequency oscillator back to the phase comparator as the comparing signal.

37. The signal processing circuit as claimed in claim 34, wherein the input data is a reference signal, and the functional circuit comprises a frequency divider for dividing the output frequency of the variable frequency oscillator, and for feeding the output whose frequency is divided back to the phase comparator as the comparing signal.

* * * * *